United States Patent
Baliga

(10) Patent No.: US 6,191,447 B1
(45) Date of Patent: Feb. 20, 2001

(54) POWER SEMICONDUCTOR DEVICES THAT UTILIZE TAPERED TRENCH-BASED INSULATING REGIONS TO IMPROVE ELECTRIC FIELD PROFILES IN HIGHLY DOPED DRIFT REGION MESAS AND METHODS OF FORMING SAME

(75) Inventor: Bantval Jayant Baliga, Raleigh, NC (US)

(73) Assignee: Micro-Ohm Corporation, Research Triangle Park, NC (US)

( * ) Notice: Under 35 U.S.C. 154(b), the term of this patent shall be extended for 0 days.

(21) Appl. No.: 09/322,424

(22) Filed: May 28, 1999

(51) Int. Cl.⁷ .................... H01L 29/76; H01L 29/94; H01L 27/095; H01L 29/47
(52) U.S. Cl. .................. 257/330; 257/333; 257/471; 257/475
(58) Field of Search .................. 257/329, 330, 257/333, 471, 481, 475

(56) References Cited

U.S. PATENT DOCUMENTS

| | | | |
|---|---|---|---|
| 3,849,789 | 11/1974 | Cordes et al. | 357/15 |
| 4,288,801 | 9/1981 | Ronen | 357/41 |
| 4,646,115 | 2/1987 | Shannon et al. | 357/15 |

(List continued on next page.)

FOREIGN PATENT DOCUMENTS

| | | | |
|---|---|---|---|
| 0 580 452 A1 | 1/1994 | (EP) | 257/330 |
| 63-296282 | 2/1988 | (JP) | 257/330 |

OTHER PUBLICATIONS

International Search Report, PCT/US00/14825, Sep. 25, 2000.

(List continued on next page.)

Primary Examiner—Steven H. Loke
(74) Attorney, Agent, or Firm—Myers Bigel Sibley & Sajovec

(57) ABSTRACT

Power semiconductor devices having tapered insulating regions include a drift region of first conductivity type therein and first and second trenches in the substrate. The first and second trenches have first and second opposing sidewalls, respectively, that define a mesa therebetween into which the drift region extends. An electrically insulating region having tapered sidewalls is also provided in each of the trenches. The tapered thickness of each of the electrically insulating regions enhances the degree of uniformity of the electric field along the sidewalls of the trenches and in the mesa and allows the power device to support higher blocking voltages despite a high concentration of dopants in the drift region. In particular, an electrically insulating region lines the first sidewall of the first trench and has a nonuniform thickness $T_{ins}(y)$ in a range between about 0.5 and 1.5 times $T_{ideal}(y)$, where $T_{ideal}(y)|_{y \geq \alpha} = \epsilon_{ins}((2\epsilon_s E_{cr}/qW_m N_d)(y-\alpha) - \frac{1}{4}W_m)/\epsilon_s$ and $\epsilon_{ins}$ is the permittivity of the electrically insulating region, $\epsilon_s$ is the permittivity of the drift region, $E_{cr}$ is the breakdown electric field strength of the drift region, q is the electron charge, $N_d$ is the first conductivity type doping concentration in the drift region, $W_m$ is a width of the mesa, y is the depth, relative to a top of the first trench, at which the thickness of the electrically insulating region is being determined and α is a constant. The constant α may equal zero in the event the power device is a Schottky rectifier and may equal the depth of the P-base region/N-drift region junction in the event the power device is a vertical MOSFET.

9 Claims, 18 Drawing Sheets

U.S. PATENT DOCUMENTS

| | | | |
|---|---|---|---|
| 4,690,729 | 9/1987 | Douglas | 156/643 |
| 4,754,310 | 6/1988 | Coe | 357/13 |
| 4,914,058 | 4/1990 | Blanchard | 437/203 |
| 4,941,026 | 7/1990 | Temple | 357/23.4 |
| 4,984,039 | 1/1991 | Douglas | 357/236 |
| 4,992,390 | 2/1991 | Chang | 437/42 |
| 5,010,378 | 4/1991 | Douglas | 357/23.6 |
| 5,126,807 | 6/1992 | Baba et al. | 357/23.4 |
| 5,216,275 | 6/1993 | Chen | 257/493 |
| 5,216,807 | 6/1993 | Yoshizawa et al. | 29/876 |
| 5,283,201 | 2/1994 | Tsang et al. | 437/31 |
| 5,298,781 | 3/1994 | Cogan et al. | 257/333 |
| 5,326,711 | 7/1994 | Malhi | 437/33 |
| 5,365,102 | 11/1994 | Mehrotra et al. | 257/475 |
| 5,366,914 | 11/1994 | Takahashi et al. | 437/41 |
| 5,424,231 | 6/1995 | Yang | 437/40 |
| 5,438,215 | 8/1995 | Tihanyi | 257/401 |
| 5,468,982 | 11/1995 | Hshieh et al. | 257/331 |
| 5,473,176 | 12/1995 | Kakumoto | 257/192 |
| 5,558,313 | 9/1996 | Hshieh et al. | 257/342 |
| 5,578,508 | 11/1996 | Baba et al. | 437/35 |
| 5,612,567 | 3/1997 | Baliga | 257/475 |
| 5,623,152 | 4/1997 | Majumdar et al. | 257/330 |
| 5,637,898 | 6/1997 | Baliga | 257/330 |
| 5,674,766 | 10/1997 | Darwish et al. | 437/40 |
| 5,683,908 | 11/1997 | Miyashita et al. | 437/67 |
| 5,693,569 | 12/1997 | Ueno | 437/203 |
| 5,696,396 * | 12/1997 | Tokura et al. | 257/330 |
| 5,700,712 | 12/1997 | Schwalke | 437/62 |
| 5,714,781 | 2/1998 | Yamamoto et al. | 247/329 |
| 5,742,076 | 4/1998 | Sridevan et al. | 257/77 |
| 5,756,386 | 5/1998 | Blanchard | 438/270 |
| 5,801,417 | 9/1998 | Tsang et al. | 257/333 |
| 5,807,789 | 9/1998 | Chen et al. | 438/714 |
| 5,811,315 | 9/1998 | Yindeepol et al. | 437/62 |
| 5,851,888 | 12/1998 | Gardner et al. | 438/301 |
| 5,861,347 | 1/1999 | Maiti et al. | 438/787 |
| 5,891,807 | 4/1999 | Muller et al. | 438/713 |
| 5,894,149 | 4/1999 | Uenishi et al. | 257/331 |
| 5,973,360 * | 10/1999 | Tihanyi | 257/330 |
| 5,976,936 | 11/1999 | Miyajima et al. | 438/268 |
| 5,986,304 | 11/1999 | Hshieh et al. | 257/330 |
| 5,998,833 * | 12/1999 | Baliga | 257/333 |

OTHER PUBLICATIONS

Kawaguchi et al., "Predicted Electrical Characteristics of 4500 V Super Multi–Resurf MOSFETs," The 11$^{th}$ International Symposium on Power Semiconductor Devices and IC's, Crowne Plaza, Toronto, Ontario, Canada, May 26–28, 1999, pp. 95–98.

Kinzer et al., "Ultra–Low Rdson 12 v P–channel trench MOSFET," The 11$^{th}$ International Symposium on Power Semiconductor Devices and IC's, Crowne Plaza, Toronto, Ontario, Canada, May 26–28, 1999, pp. 303–306.

Lee et al., "SOI High Voltage Integrated Circuit Technology for Plasma Display Panel Driver," The 11$^{th}$ International Symposium on Power Semiconductor Devices and IC's, Crowne Plaza, Toronto, Ontario, Canada, May 26–28, 1999, pp. 286–288.

Lorenz et al., "COOLMOS™—a new milestone in high voltage Power MOS," The 11$^{th}$ International Symposium on Power Semiconductor Devices and IC's, Crowne Plaza, Toronto, Ontario, Canada, May 26–28, 1999, pp. 3–10.

Nemoto et al., "The Recessed–Gate IGBT Structure," The 11$^{th}$ International Symposium on Power Semiconductor Devices and IC's, Crowne Plaza, Toronto, Ontario, Canada, May 26–28, 1999, pp. 149–152.

Peters et al. "Electrical performance of triple implanted vertical silicon carbide MOSFETs with low on–resistance," The 11$^{th}$ International Symposium on Power Semiconductor Devices and IC's, Crowne Plaza, Toronto, Ontario, Canada, May 26–28, 1999, pp. 103–106.

Schlögl et al., "Properties of CoolMOS™ between 420K and 80K—The Ideal Device for Cryogenic Applications," The 11$^{th}$ International Symposium on Power Semiconductor Devices and IC's, Crowne Plaza, Toronto, Ontario, Canada, May 26–28, 1999, pp. 91–94.

Shenoy et al., "Analysis of the Effect of Charge Imbalance on the Static and Dynamic Characteristics of the Super Junction MOSFET," The 11$^{th}$ International Symposium on Power Semiconductor Devices and IC's, Crowne Plaza, Toronto, Ontario, Canada, May 26–28, 1999, pp. 99–102.

Trivedi et al., "Comparison of RF Performance of Vertical and Lateral DMOSFET," The 11$^{th}$ International Symposium on Power Semiconductor Devices and IC's, Crowne Plaza, Toronto, Ontario, Canada, May 26–28, 1999, pp. 245–248.

You et al., "A New Trench Bipolar Junction Diode (TBJD)," The 11$^{th}$ International Symposium on Power Semiconductor Devices and IC's, Crowne Plaza, Toronto, Ontario, Canada, May 26–28, 1999, pp. 133–136.

Zeng et al., "An Improved Power MOSFET Using a Novel Split Well Structure," The 11$^{th}$ International Symposium on Power Semiconductor Devices and IC's, Crowne Plaza, Toronto, Ontario, Canada, May 26–28, 1999, pp. 205–208.

Baba et al., A Study on a High Blocking Voltage UMOS–FET With a Double Gate Structure, Proceedings of 1992 International Symposium on Power Semiconductor Devices & ICs, 1992, pp. 300–302.

* cited by examiner

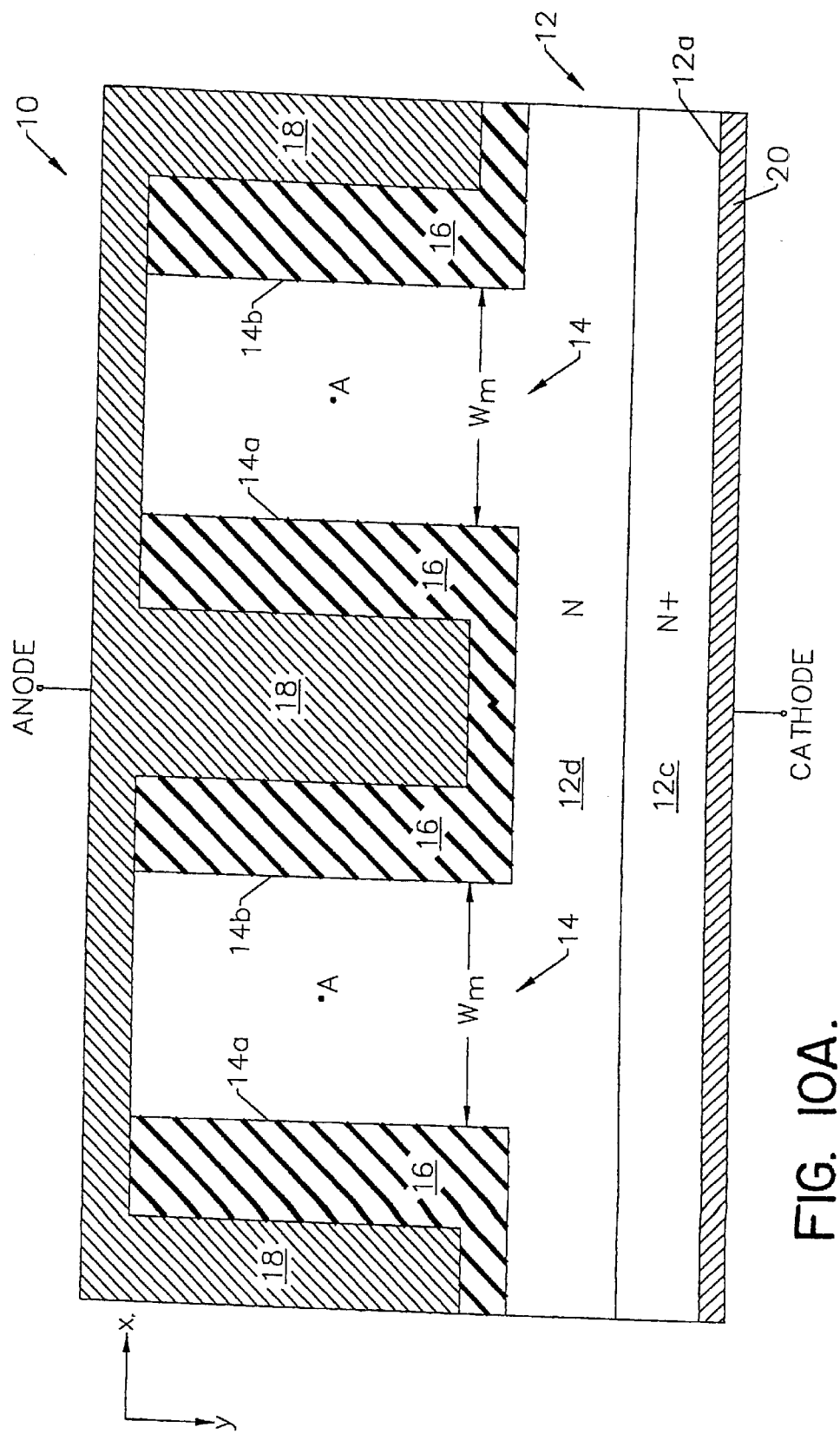
FIG. IOA.
(PRIOR ART)

POWER SEMICONDUCTOR DEVICES THAT UTILIZE TAPERED TRENCH-BASED INSULATING REGIONS TO IMPROVE ELECTRIC FIELD PROFILES IN HIGHLY DOPED DRIFT REGION MESAS AND METHODS OF FORMING SAME

FIELD OF THE INVENTION

The present invention relates to semiconductor switching devices, and more particularly to switching devices for high power applications.

BACKGROUND OF THE INVENTION

The silicon bipolar transistor has been the device of choice for high power applications in motor drive circuits, appliance controls, robotics and lighting ballasts. This is because bipolar transistors can be designed to handle relatively large current densities in the range of 40–50 A/cm$^2$ and support relatively high blocking voltages in the range of 500–1000V.

Despite the attractive power ratings achieved by bipolar transistors, there exist several fundamental drawbacks to their suitability for all high power applications. First of all, bipolar transistors are current controlled devices which require relatively large base currents, typically one fifth to one tenth of the collector current, to maintain the transistor in an operating mode. Proportionally larger base currents can be expected for applications which also require high speed turn-off. Because of the large base current demands, the base drive circuitry for controlling turn-on and turn-off is relatively complex and expensive. Bipolar transistors are also vulnerable to premature breakdown if a high current and high voltage are simultaneously applied to the device, as commonly required in inductive power circuit applications. Furthermore, it is relatively difficult to operate bipolar transistors in parallel because current diversion to a single transistor typically occurs at high temperatures, making emitter ballasting schemes necessary.

The silicon power MOSFET was developed to address this base drive problem. In a power MOSFET, the gate electrode provides turn-on and turn-off control upon the application of an appropriate gate bias. For example, turn-on in an N-type enhancement MOSFET occurs when a conductive N-type inversion layer is formed in the P-type base region (also referred to as "channel region") in response to the application of a positive gate bias. The inversion layer electrically connects the N-type source and drain regions and allows for majority carrier conduction therebetween.

The power MOSFET's gate electrode is separated from the base region by an intervening insulating layer, typically silicon dioxide. Because the gate is insulated from the base region, little if any gate current is required to maintain the MOSFET in a conductive state or to switch the MOSFET from an on-state to an off-state or vice-versa. The gate current is kept small during switching because the gate forms a capacitor with the MOSFET's base region. Thus, only charging and discharging current ("displacement current") is required during switching. Because of the high input impedance associated with the insulated-gate electrode, minimal current demands are placed on the gate and the gate drive circuitry can be easily implemented. Moreover, because current conduction in the MOSFET occurs through majority carrier transport only, the delay associated with the recombination and storage of excess minority carriers is not present. Accordingly, the switching speed of power MOSFETs can be made orders of magnitude faster than that of bipolar transistors. Unlike bipolar transistors, power MOSFETs can be designed to withstand high current densities and the application of high voltages for relatively long durations, without encountering the destructive failure mechanism known as "second breakdown". Power MOSFETs can also be easily paralleled, because the forward voltage drop across power MOSFETs increases with increasing temperature, thereby promoting an even current distribution in parallel connected devices.

In view of these desirable characteristics, many variations of power MOSFETs have been designed. Two popular types are the double-diffused MOSFET device (DMOSFET) and the UMOSFET device. These and other power MOSFETs are described in a textbook by B. J. Baliga entitled *Power Semiconductor Devices*, PWS Publishing Co. (ISBN 0-534-94098-6) (1995), the disclosure of which is hereby incorporated herein by reference. Chapter 7 of this textbook describes power MOSFETs at pages 335–425. Examples of silicon power MOSFETs including accumulation, inversion and extended trench FETs having trench gate electrodes extending into the N+ drain region are also disclosed in an article by T. Syau, P. Venkatraman and B. J. Baliga, entitled *Comparison of Ultralow Specific On-Resistance UMOSFET Structures: The ACCUFET, EXTFET, INVFET, and Convention UMOSFETs*, IEEE Transactions on Electron Devices, Vol. 41, No. 5, May (1994). As described by Syau et al., specific on-resistances in the range of 100–250 $\mu\Omega$cm$^2$ were experimentally demonstrated for devices capable of supporting a maximum of 25 volts. However, the performance of these devices was limited by the fact that the forward blocking voltage must be supported across the gate oxide at the bottom of the trench.

FIG. 1, which is a reproduction of FIG. 1(*d*) from the aforementioned Syau et al. article, discloses a conventional UMOSFET structure. In the blocking mode of operation, this UMOSFET supports most of the forward blocking voltage across the N-type drift layer which must be doped at relatively low levels to obtain a high maximum blocking voltage capability, however low doping levels typically increase the on-state series resistance. Based on these competing design requirements of high blocking voltage and low on-state resistance, a fundamental figure of merit for power devices has been derived which relates specific on-resistance ($R_{on,sp}$) to the maximum blocking voltage (BV). As explained at page 373 of the aforementioned textbook to B. J. Baliga, the ideal specific on-resistance for an N-type silicon drift region is given by the following relation:

$$R_{on,sp}=5.93\times10^{-9}(BV)^{2.5} \tag{1}$$

Thus, for a device with 60 volt blocking capability, the ideal specific on-resistance is 170 $\mu\Omega$cm$^2$. However, because of the additional resistance contribution from the inversion-layer channel in the base region (e.g., P-type base region in an N-channel MOSFET), reported specific on-resistances for UMOSFETs are typically much higher. For example, a UMOSFET having a specific on-resistance of 730 $\mu\Omega$cm$^2$ is disclosed in an article by H. Chang, entitled *Numerical and Experimental Comparison of 60V Vertical Double-Diffused MOSFETs and MOSFETs With A Trench-Gate Structure*, Solid-State Electronics, Vol. 32, No. 3, pp. 247–251, (1989). However, in this device a lower-than-ideal uniform doping concentration in the drift region was required to compensate for the high concentration of field lines near the bottom corner of the trench when blocking high forward voltages. U.S. Pat. Nos. 5,637,898 and 5,742,076 also disclose popular power semiconductor devices having vertical current carrying capability.

In particular, U.S. Pat. No. 5,637,898 to Baliga discloses a preferred silicon field effect transistor which is commonly referred to as a graded-doped (GD) UMOSFET. As illustrated by FIG. 2, which is a reproduction of FIG. 3 from the '898 patent, a unit cell 100 of an integrated power semiconductor device field effect transistor may have a width "$W_c$" of 1 µm and comprise a highly doped drain layer 114 of first conductivity type (e.g., N+) substrate, a drift layer 112 of first conductivity type having a linearly graded doping concentration therein, a relatively thin base layer 116 of second conductivity type (e.g., P-type) and a highly doped source layer 118 of first conductivity type (e.g., N+). The drift layer 112 may be formed by epitaxially growing an N-type in-situ doped monocrystalline silicon layer having a thickness of 4 µm on an N-type drain layer 114 having a thickness of 100 µm and a doping concentration of greater than $1\times10^{18}$ cm$^{-3}$ (e.g. $1\times10^{19}$ cm$^{-3}$) therein. The drift layer 112 also has a linearly graded doping concentration therein with a maximum concentration of $3\times10^{17}$ cm$^{-3}$ at the N+/N junction with the drain layer 114, and a minimum concentration of $1\times10^{16}$ cm$^{-3}$ beginning at a distance 3 µm from the N+/N junction (i.e., at a depth of 1 µm) and continuing at a uniform level to the upper face. The base layer 116 may be formed by implanting a P-type dopant such as boron into the drift layer 112 at an energy of 100 kEV and at a dose level of $1\times10^{14}$ cm$^{-2}$. The P-type dopant may then be diffused to a depth of 0.5 µm into the drift layer 112. An N-type dopant such as arsenic may also be implanted at an energy of 50 kEV and at dose level of $1\times10^{15}$ cm$^{-2}$. The N-type and P-type dopants can then be diffused simultaneously to a depth of 0.5 µm and 1.0 µm, respectively, to form a composite semiconductor substrate containing the drain, drift, base and source layers.

A stripe-shaped trench having a pair of opposing sidewalls 120a which extend in a third dimension (not shown) and a bottom 120b is then formed in the substrate. For a unit cell 100 having a width $W_c$ of 1 µm, the trench is preferably formed to have a width "$W_t$" of 0.5 µm at the end of processing. An insulated gate electrode, comprising a gate insulating region 124 and an electrically conductive gate 126 (e.g., polysilicon), is then formed in the trench. The portion of the gate insulating region 124 extending adjacent the trench bottom 120b and the drift layer 112 may have a thickness "$T_1$" of about 2000 Å to inhibit the occurrence of high electric fields at the bottom of the trench and to provide a substantially uniform potential gradient along the trench sidewalls 120a. The portion of the gate insulating region 124 extending opposite the base layer 116 and the source layer 118 may have a thickness "$T_2$" of about 500 Å to maintain the threshold voltage of the device at about 2–3 volts. Simulations of the unit cell 100 at a gate bias of 15 Volts confirm that a vertical silicon field effect transistor having a maximum blocking voltage capability of 60 Volts and a specific on-resistance ($R_{sp,on}$) of 40 µΩcm$^2$, which is four (4) times smaller than the ideal specific on-resistance of 170 µΩcm$^2$ for a 60 volt power UMOSFET, can be achieved. Notwithstanding these excellent characteristics, the transistor of FIG. 2 may suffer from a relatively low high-frequency figure-of-merit (HFOM) if the overall gate-to-drain capacitance ($C_{GD}$) is too large. Improper edge termination of the GD-UMOSFET may also prevent the maximum blocking voltage from being achieved.

Schottky barrier rectifiers have also been used extensively as output rectifiers in switching-mode power supplies and in other high-speed power switching applications, such as motor drives, for carrying large forward currents and supporting reverse blocking voltages of up to 100 Volts. As is well known to those having skill in the art, Schottky rectifiers typically exhibit low resistance to current flow in a forward direction and a very high resistance to current flow in a reverse direction. As is also well known to those having skill in the art, a Schottky rectifier produces rectification as a result of nonlinear unipolar current transport across a metal-semiconductor contact.

There are basically four distinct processes for the transport of predominantly unipolar charge carriers across a metal/N-type semiconductor contact. The four processes are (1) transport of electrons from the semiconductor over a metal/semiconductor potential barrier and into the metal (thermionic emission), (2) quantum-mechanical tunneling (field emission) of electrons through the barrier, (3) recombination in the space-charge region and (4) hole injection from the metal to the semiconductor. In addition, edge leakage currents, caused by high electric fields at the metal contact periphery, as well as interface currents, caused by the presence of traps at the metal-semiconductor interface, may also be present.

Current flow by means of thermionic emission (1) is generally the dominant process for Schottky power rectifiers with moderately doped semiconductor regions (e.g., Si with doping concentration $\leq 1\times10^{16}$ cm$^{-3}$), operated at moderate temperatures (e.g., 300K). Moderate doping of the semiconductor region also generally produces a relatively wide potential barrier between the metal and semiconductor regions and thereby limits the proportion of current caused by tunneling (2). Space-charge recombination current (3) is similar to that observed in a P-N junction diode and is generally significant only at very low forward current densities. Finally, current transport due to minority carrier injection (4) is generally significant only at large forward current densities.

As the voltages of modern power supplies continue to decrease in response to need for reduced power consumption and increased energy efficiency, it becomes more advantageous to decrease the on-state voltage drop across a power rectifier, while still maintaining high forward-biased current density levels. As well known to those skilled in the art, the on-state voltage drop is generally dependent on the forward voltage drop across the metal/semiconductor junction and the series resistance of the semiconductor region and cathode contact.

The need for reduced power consumption also generally requires minimizing the reverse-biased leakage current. The reverse-biased leakage current is the current in the rectifier during a reverse-biased blocking mode of operation. To sustain high reverse-biased blocking voltages and minimize reverse-biased leakage currents, the semiconductor portion of the rectifier is typically lightly doped and made relatively thick so that the reverse-biased electric field at the metal/semiconductor interface does not become excessive. The magnitude of the reverse-biased leakage current for a given reverse-biased voltage is also inversely dependent on the Schottky barrier height (potential barrier) between the metal and semiconductor regions. Accordingly, to achieve reduced power consumption, both the forward-biased voltage drop and reverse-biased leakage current should be minimized and the reverse blocking voltage should be maximized.

Unfortunately, there is a tradeoff between the forward-biased voltage drop and the reverse-biased leakage current in a Schottky barrier rectifier, so that it is generally difficult to minimize both characteristics simultaneously. In general, as the Schottky barrier height is reduced, the forward voltage drop decreases but the reverse-biased leakage current increases. Conversely, as the barrier height is increased, the forward voltage drop increases but the leakage current decreases. The doping level in the semiconductor region also plays a significant role. Generally, the higher the doping level, the lower the forward-biased voltage drop but the reverse-biased breakdown voltage is reduced because of impact-ionization.

Therefore, in designing Schottky barrier rectifiers, design parameters such as barrier heights and semiconductor doping levels are generally selected to meet the requirements of a particular application because all device parasitics cannot be simultaneously minimized. Low barrier heights are typically used for Schottky rectifiers intended for high current operation with large duty cycles, where the power losses during forward conduction are dominant. High barrier heights are typically used for Schottky rectifiers intended for applications with higher ambient temperatures or requiring high reverse blocking capability.

The height of the Schottky barrier formed by the metal/semiconductor junction is related to the work function potential difference between the metal contact and the semiconductor substrate. A graphical illustration of the relationship between metal work function and Schottky barrier height may be found in Chapter 5, FIG. 3 of the textbook by S. M. Sze entitled *Semiconductor Devices, Physics and Technology*, John Wiley & Sons, 1985, at page 163. A detailed and comprehensive discussion of the design of Schottky barrier power rectifiers may be found in Chapter 4 of a textbook by B. J. Baliga entitled *Power Semiconductor Devices*, PWS Publishing Co., ISBN 0-534-94098-6 (1995), the disclosure of which is hereby incorporated herein by reference. In particular, sections 4.1.2 and 4.1.3 of the Baliga textbook disclose the semiconductor physics associated with both forward conduction and reverse blocking in a parallel-plane Schottky rectifier, having the structure of FIG. 4.5 therein. As set forth in Equation 4.7, the forward voltage drop is dependent on the drift region, substrate and contact resistances ($R_D$, $R_S$ and $R_C$) and the forward current density ($J_F$), as well as the saturation current ($J_S$) which is a function of the Schottky barrier height ($\phi_{bn}$) The maximum reverse blocking voltage (i.e., breakdown voltage) of a Schottky rectifier ($BV_{PP}$) is also disclosed as ideally being equal to that of a one-sided abrupt parallel-plane P-N junction rectifier (e.g., $P^+$-N or $N^+$-P), having the structure of FIG. 3.3 of the Baliga textbook. The breakdown voltage ($BV_{PP}$) is dependent on the doping concentration of the drift region ($N_D$), as described by Equation (1) below.

$$N_D = 2 \times 10^{18} (BV_{PP})^{4/3} \qquad (1)$$

Equation (1) is a reproduction of Equation 4.11 from the aforementioned Baliga textbook. A graphical representation of breakdown voltage and depletion layer width ($W_{pp}$) at breakdown versus drift region doping ($N_D$) for an abrupt parallel-plane P-N junction rectifier is shown by FIG. 3.4 from the aforementioned Baliga textbook.

In reality, however, the actual breakdown voltage of a conventional Schottky rectifier is about one-third (⅓) that for the abrupt parallel-plane P-N junction rectifier described by Equation (1). As will be understood by those skilled in the art, the reduction in breakdown voltage below the theoretical ideal parallel plane value is caused, in part, by image-force-induced lowering of the potential barrier between the metal and the semiconductor regions, which occurs at reverse-biased conditions.

One attempt to optimize the on-state voltage drop/reverse blocking voltage tradeoff associated with the Schottky barrier rectifier is the Junction Barrier controlled Schottky (JBS) rectifier. The JBS rectifier is a Schottky rectifier having an array of Schottky contacts at the face of a semiconductor substrate with corresponding semiconductor channel regions beneath the contacts. The JBS rectifier also includes a P-N junction grid interspersed between the Schottky contacts. This device is also referred to as a "pinch" rectifier, based on the operation of the P-N junction grid. The P-N junction grid is designed so that the depletion layers extending from the grid into the substrate will not pinch-off the channel regions to forward-biased currents, but will pinch-off the channel regions to reverse-biased leakage currents.

As will be understood by those skilled in the art, under reverse bias conditions, the depletion layers formed at the P-N junctions spread into the channel regions, beneath the Schottky barrier contacts. The dimensions of the grid and doping levels of the P-type regions are generally designed so that the depletion layers intersect under the array of Schottky contacts, when the reverse bias exceeds a few volts, and cause pinch-off. Pinch-off of the channels by the depletion layers cause the formation of a potential barrier in the substrate so that further increases in the reverse-biased voltage are supported by the depletion layers. Accordingly, once a threshold reverse-biased voltage is achieved, the depletion layers shield the Schottky barrier contacts from further increases in the reverse-biased voltage. This shielding effect generally prevents the lowering of the Schottky barrier potential at the interface between the metal contacts and semiconductor substrate and inhibits the formation of large reverse leakage currents.

The design and operation of the JBS rectifier is described in Section 4.3 of the aforementioned Baliga textbook and in U.S. Pat. No. 4,641,174 to Baliga, entitled Pinch Rectifier, the disclosure of which is hereby incorporated herein by reference. For example, as shown by FIG. 6 of the '174 patent, reproduced herein as FIG. 3, an embodiment of a pinch rectifier 200 comprises a plurality of Schottky rectifying contacts 232 formed by metal layer 230 and substrate 204 and a P-N junction grid formed by regions 234 and substrate 204. Unfortunately, the JBS rectifier typically possesses a relatively large series resistance and a relatively large on-state forward voltage drop caused by the reduction in overall Schottky contact area dedicated to forward conduction. This reduction in area is necessarily caused by the presence of the P-N junction grid which occupies a significant percentage of the total area at the face of the substrate. In addition, large forward currents can cause large forward voltage drops and can lead to the onset of minority carrier conduction (i.e., bipolar), which limits the performance of the JBS rectifier at high switching rates. Finally, although the reverse blocking voltage for the JBS may be somewhat higher than the reverse blocking voltage for a Schottky rectifier having an equivalent drift region doping ($N_D$), it generally does not achieve the level of reverse blocking capability attainable with a parallel-plane P-N junction, as illustrated by FIG. 2.

Another attempt to optimize the forward voltage drop/reverse blocking voltage tradeoff is disclosed in U.S. Pat. No. 4,982,260 to Chang et al. entitled *Power Rectifier with Trenches*, the disclosure of which is hereby incorporated herein by reference. For example, as shown by FIGS. 10B and 14B, reproduced herein as FIGS. 4 and 5, respectively, conventional P-i-N rectifiers ($P^+$-$N^-$-$N^+$) are modified to include an interspersed array of Schottky contacts on a face of an N-type semiconductor substrate. As shown by FIG. 4, the Schottky contact regions 550A–C are separated from the $P^+$ portions 510A–D (of the P-i-N rectifier) by MOS trench regions 522A–522F. In another embodiment shown by FIG.

5, the Schottky contact regions 718A–E are interspersed adjacent the P+ portions 720A–F, which are formed at the bottom of trenches 710A–F. As will be understood by those skilled in the art, these modified P-i-N rectifiers also typically possess an unnecessarily large series resistance in the drift region (N⁻ regions 506, 706). Moreover, only a relatively small percentage of forward-conduction area is dedicated to the Schottky contacts, which dominate the forward bias characteristics by turning on at lower forward voltages than the parallel connected P+-N junctions. Finally, although the forward leakage current for these P-i-N type rectifiers is substantially lower than the corresponding forward leakage current for a Schottky rectifier, like the JBS rectifier, they do not achieve the level of reverse blocking capability associated with an abrupt parallel-plane P-N junction.

However, U.S. Pat. No. 5,365,102 to Mehrotra and inventor Baliga, entitled *Schottky Barrier Rectifier with MOS Trench,* the disclosure of which is hereby incorporated herein by reference, discloses Schottky barrier rectifiers which have a higher breakdown voltage than theoretically attainable with an ideal abrupt parallel-plane P-N junction. A cross-sectional representation of one embodiment of the described rectifiers, referred to as the TMBS rectifier, is illustrated by FIG. 6 and described in an article by Mehrotra and inventor Baliga entitled *Trench MOS Barrier Schottky (TMBS) Rectifier: A Schottky Rectifier With Higher Than Parallel Plane Breakdown Voltage,* Solid-State Elec., Vol. 38, No. 4, pp. 801–806 (1995), the disclosure of which is hereby incorporated herein by reference.

In particular, better than theoretically ideal breakdown voltage characteristics were achieved because of the occurrence of charge coupling between the majority charge carriers in the mesa-shaped portion of the epitaxial/drift region and the metal on the insulated sidewalls of the trenches. This charge coupling produced a redistribution of the electric field profile under the Schottky contact which resulted in a breakdown voltage of about 25 Volts being achieved for a uniform drift region doping concentration of $1 \times 10^{17}$ cm$^{-3}$ and oxide thickness of 500 Å, as opposed to 9.5 Volts for an ideal abrupt parallel-plane rectifier. Furthermore, because the peak electric field at the metal-semiconductor contact was reduced relative to an ideal rectifier, reverse leakage current was also reduced.

The redistribution of the electric field profile, relative to an ideal parallel-plane rectifier with drift region doping concentration of $3 \times 10^{16}$ cm$^{-3}$, is illustrated by FIG. 7 for various trench depths ("d"). FIG. 7 is a reproduction of FIG. 2 from the aforementioned Mehrotra and Baliga article. As shown by FIG. 7, there are at least two distinct effects associated with the charge coupling between the trench electrodes and mesa. First, the electric field at center of the Schottky contact is reduced significantly and second, the peak in the electric field profile shifts away from the metal-semiconductor contact and into the drift region. The reduction in electric field at the center of the Schottky contact causes a significant decrease in the reverse leakage current through a reduction in Schottky barrier height lowering and as the peak of the electric field moves away from the Schottky contact, the mesa is able to support more voltage than parallel-plane theory predicts.

A graphical illustration of breakdown voltage versus trench oxide thickness for the TMBS rectifier of FIG. 6 is illustrated by FIG. 8, which is a reproduction of FIG. 4(b) from the aforementioned Mehrotra and Baliga article. As shown by FIG. 8, increases in oxide thickness beyond 750 Å cause a significant decrease in breakdown voltage. This decrease in breakdown voltage with increasing oxide thickness can be attributed to reduced charge coupling between the anode electrode on the trench sidewalls and the mesa-shaped portion of the drift region. A graphical illustration of breakdown voltage versus trench depth for the TMBS rectifier of FIG. 6 is also illustrated by FIG. 9, which is a reproduction of FIG. 3 from the aforementioned Mehrotra and Baliga article. As shown by FIG. 9, increases in trench depth beyond 2.5 μm do not cause a continuing increase in breakdown voltage beyond about 25 Volts. In other words, the breakdown voltage does not continue to scale with increases in trench depth beyond 2.5 μm.

Referring now to FIG. 10A, a cross-sectional illustration of a graded-doped TMBS rectifier (GD-TMBS rectifier) having excellent I-V characteristics is illustrated. This rectifier of FIG. 10A is more fully described in U.S. Pat. No. 5,612,567 to Baliga, entitled "Schottky Barrier Rectifiers and Methods of Forming Same", the disclosure of which is hereby incorporated herein by reference. The rectifier 10 includes a semiconductor substrate 12 of first conductivity type, typically N-type conductivity, having a first face 12a and a second opposing face 12b. The substrate 12 preferably comprises a relatively highly doped cathode region 12c (shown as N+) adjacent the first face 12a. As illustrated by FIG. 10B, the cathode region 12c is doped to a uniform first conductivity type dopant concentration of about $1 \times 10^{19}$ cm$^{-3}$. An optimally nonuniformly doped drift region 12d of first conductivity type (shown as N) preferably extends from the cathode region 12c to the second face 12b. As illustrated, the drift region 12d and cathode region 12c form a non-rectifying N+/N junction which extends opposite the first face 12a. A mesa 14 having a cross-sectional width "$W_m$", defined by opposing sides 14a and 14b, is preferably formed in the drift region 12d. The mesa 14 can be of stripe, rectangular, cylindrical or other similar geometry and extends in a third dimension (not shown). As will be understood by those skilled in the art, the mesa 14 can be formed in the drift region 12d by etching pairs of adjacent stripe-shaped trenches which extend in a third dimension (not shown), using conventional processing techniques. Alternatively, an annular-shaped trench may also be formed in the drift region 12d to define the mesa 14. However, when viewed in transverse cross section, the inner sidewall of the annular trench appears as a pair of opposing sidewalls 14a and 14b of adjacent trenches and will be described herein as such.

An insulating region 16 (e.g., SiO$_2$) is also provided on the opposing mesa sides 14a and 14b, respectively. To facilitate achievement of a high breakdown voltage and inhibit field crowding, the insulating region 16 is formed to have a thickness greater than 1000 Å, and more preferably about 2000 Å. The rectifier also includes an anode electrode 18 on the insulating region 16 and on the second face 12b. The anode electrode 18 forms a Schottky barrier rectifying junction with the drift region 12d at the top face of the mesa 14. The height of the Schottky barrier formed at the anode electrode/mesa interface is dependent on the type of electrode metal and semiconductor (e.g., Si, Ge, GaAs, and SiC) used and the magnitude and profile of the first conductivity type doping concentration in the mesa 14. Finally, a cathode electrode 20 is provided adjacent the cathode region 12c at the first face 12a. The cathode electrode 20 preferably ohmically contacts the cathode region 12c.

As described in the '567 patent, significantly higher reverse breakdown voltages of about 60 Volts can be achieved with the rectifier of FIG. 10A by, among other things, nonuniformly doping the drift region 12d so that the concentration of first conductivity type dopants therein preferably increases monotonically from less than about 5×10$^{16}$ cm$^{-3}$, and more preferably less than about 2×10$^{16}$ cm$^{-3}$, to greater than about 1×10$^{17}$ cm$^{-3}$, in a direction (shown by the y-axis) from the second face 12b to the cathode region 12c. This direction is orthogonal to the second face 12b and the Schottky rectifying junction formed by the anode electrode 18 and mesa 14. In particular, the concentration of first conductivity type dopants in the drift region 12d is most preferably about 1×10$^{16}$ cm$^{-3}$ at the second face 12b and most preferably about 3×10$^{17}$ cm$^{-3}$ at the nonrectifying junction. As also illustrated best by FIG. 10B, the profile of the first conductivity type dopant concentration in the drift region 12d is preferably a linear graded profile, however a step, curve or similarly graded profile can be utilized as well. As will be understood by those skilled in the art, the described profiles of the first conductivity type dopants can be achieved by epitaxially growing the drift region 12d on the cathode region 12c and performing computer-controlled in-situ doping by varying the concentration of the first conductivity type dopants as a function of growth time.

In addition to nonuniformly doping the drift region 12d in an optimum manner as described, increasing the height of the mesa 14 (or trench depth) to about 3.0 μm and increasing the thickness of the insulating region 16 from 500 Å to greater than about 1000 Å, and most preferably to about 2000 Å, also contributes to an increase in the reverse breakdown voltage. For example, the reverse breakdown voltage was about 60 Volts for the rectifier of FIG. 10A having a drift region thickness of about 3.5 μm and a mesa width of about 0.4 μm. This 60 Volt breakdown voltage level for the GD-TMBS is more than two times greater than the maximum breakdown voltage achievable with the TMBS rectifier of FIG. 6. The increase in reverse breakdown voltage to 60 Volts can be attributed, in part, to the achievement of a substantially uniform vertical electric field profile at the center of the mesa 14, at the onset of breakdown.

The profile of the electric field in the center of the mesa 14 versus distance from the second face 12b is best illustrated by FIG. 11. As illustrated, the electric field profile is substantially uniform in the GD-TMBS, relative to the profiles of FIG. 7 for the TMBS rectifier. However, flat and negative slopes are present so that the actual profile of the electric field strength is monotonically decreasing in an orthogonal direction from the second face 12b to the cathode region 12c. Moreover, in contrast to the electric field profile of FIG. 7 which illustrates two peak electric field values, one at the Schottky junction and one at a distance therefrom which is equal to the trench depth of 2.0 μm, the electric field profile in FIG. 11 has a single peak at the second face 12b and the field at point "A" at the center of the mesa 14 and at a distance 1.5 μm from the face 12b (i.e., half the trench depth) is greater than about one-half the peak electric field and more preferably, greater than about 80% of the peak electric field. This substantially uniform electric field profile at the vertical center of the mesa 14 contributes to the achievement of high reverse breakdown voltage. This preferred electric field profile is also a consequence of the nonuniform drift region doping concentration and increased insulating region thickness.

Referring now to FIG. 12, a graphical illustration of breakdown voltage versus trench oxide thickness for the GD-TMBS rectifier according to U.S. Pat. No. 5,612,567 is provided. In particular, the breakdown voltage is shown as monotonically increasing with oxide thickness up to at least 2200 Å, which is not disclosed or suggested by the profile of FIG. 8. The graphical illustration of FIG. 12 was obtained for a GD-TMBS rectifier having a doping profile in accordance with FIG. 10B with limits of 1×10$^{16}$ cm$^{-3}$ at the second face 12b and 3×10$^{17}$ cm$^{-3}$ at the non-rectifying junction formed by the drift region 12d and cathode region 12c. The mesa width and cell pitch were also 0.5 μm and 1 μm, respectively, and the trench depth and thickness of the drift region 12d were 3 μm and 4 μm, respectively. A graphical illustration of breakdown voltage versus trench depth for a Schottky rectifier of U.S. Pat. No. 5,612,567 is also provided in FIG. 13. In contrast to FIG. 9, the breakdown voltage is also shown as increasing in an approximate straight line manner as a function of trench depth for depths up to at least 5.0 μm. In particular, a breakdown voltage of about 100 Volts can be achieved with a trench depth of 5.0 μm.

Notwithstanding the excellent I-V characteristics provided by the above-described GD-UMOSFETs and GD-TMBS rectifiers, there continues to be a need for power semiconductor devices having even better I-V characteristics including higher blocking voltage capability and lower on-state resistance.

SUMMARY OF THE INVENTION

It is therefore an object of the present invention to provide improved semiconductor switching devices for high power applications and methods of forming same.

It is another object of the present invention to provide semiconductor switching devices that can have low on-state resistance and high blocking voltage capability and methods of forming same.

These and other objects, advantages and features of the present invention can be provided by power semiconductor devices that comprise a semiconductor substrate having a drift region of first conductivity type therein and first and second trenches in the substrate. The first and second trenches have first and second opposing sidewalls, respectively, that define a mesa therebetween into which the drift region extends. According to a preferred aspect of the present invention, an electrically insulating region having tapered sidewalls is provided in each of the trenches. This tapered thickness of each of the electrically insulating regions can enhance the degree of uniformity of the electric field along the sidewalls of the trenches and in the mesa and can allow the power device to support higher blocking voltages despite a high concentration of dopants in the drift region.

In particular, an electrically insulating region lines the first sidewall of the first trench and has a nonuniform thickness $T_{ins}(y)$ in a range between about 0.5 and 1.5 times $T_{ideal}(y)$, where $T_{ideal}(y)|_{y \geq \alpha} = \epsilon_{ins}((2\epsilon_s E_{cr}/qW_m N_d)(y-\alpha) - \frac{1}{4}W_m)/\epsilon_s$ and $\epsilon_{ins}$ is the permittivity of the electrically insulating region, $\epsilon_s$ is the permittivity of the drift region, $E_{cr}$ is the breakdown electric field strength of the drift region, q is the electron charge, $N_d$ is the first conductivity type doping concentration in the drift region, $W_m$ is a width of the mesa, y is the depth, relative to a top of the first trench, at which the thickness of the electrically insulating region is being determined and a is α constant. The constant α may equal zero in the event the power device is a Schottky rectifier and may equal the depth of the P-base region/N-drift region junction in the event the power device is a vertical MOSFET, for example. An electrode is also provided in the first trench and is electrically insulated from the sidewalls and bottom of the first trench by the electrically insulating region. The nonuniform thickness of the electrically insulating region may also manifest itself as a linear, curvilinear or multiple step-wise taper that extends outwardly relative to a bottom of the first trench at a nonzero average slope relative to the sidewall of the first trench.

According to another preferred aspect of the present invention, the drift region may be uniformly doped at a high level in excess of $1\times10^{17}$ cm$^{-3}$ so that the on-state resistance of the power device can be maintained at a low level. Moreover, based on the preferred slope of the tapered sidewalls of the electrically insulating region, a product of a width of the mesa and the first conductivity type dopant concentration in the drift region is preferably set at a level in a range between about $5\times10^{12}$ cm$^{-2}$ and $7.5\times10^{12}$ cm$^{-2}$ to provide optimum charge coupling for creating a uniform electric field.

According to one embodiment of the invention, the drift region may extend to a surface of the semiconductor substrate and the electrode may be provided as a Schottky rectifying contact on the surface. According to another embodiment, a vertical MOSFET may be provided by forming a base region of second conductivity type in the substrate so that the base region forms a first P-N rectifying junction with the drift region that extends to the sidewall of the first trench. A source region of first conductivity type is also provided in the substrate. The source region forms a second P-N rectifying junction with the base region. According to this embodiment, the electrode in the trench constitutes a gate electrode and a separate source electrode may be provided in ohmic contact with the source region. In addition, because the second conductivity type doping concentration in the base region may follow a nonuniform profile (e.g., gaussian profile), the tapered sidewall of the electrically insulating region may also extend opposite the base region so that a first thickness of the electrically insulating region at a location extending opposite the first P-N rectifying junction is greater than a second thickness of the electrically insulating region at a location extending opposite the second P-N rectifying junction. In other words, the thickness of the portion of the electrically insulating region extending between the base region and the gate electrode in a preferred MOSFET can be tapered without adversely affecting the on-state characteristics of an inversion-layer channel formed in the base region.

Preferred methods of forming power semiconductor devices comprise the steps of forming a trench in a semiconductor substrate and then lining a bottom and sidewalls of the trench with an electrically insulating layer. Next, the trench is filled with a sacrificial electrically conductive region (e.g., polysilicon). A step is then performed to etch the electrically insulating layer at a first rate while simultaneously etching the sacrificial electrically conductive region at a second rate greater than the first rate (e.g., 10:1), so that the electrically insulating layer has tapered sidewalls that extend outwardly, relative to the bottom of the trench, at an average slope of greater than about 500 Å/μm relative to the sidewalls of the trench. The trench is then refilled with an electrically conductive electrode. Other preferred techniques may also be used to form an electrically insulating layer that has a linear, curvilinear or multiple step-wise taper and these techniques should be performed so that the resulting electrically insulating layer has a nonuniform thickness $T_{ins}(y)$ in a range between about 0.5 and 1.5 times $T_{ideal}(Y)$, as specified above.

BRIEF DESCRIPTION OF THE DRAWINGS

FIG. 10A illustrates a cross-sectional representation of a Schottky rectifier according to U.S. Pat. No. 5,612,567.

DESCRIPTION OF PREFERRED EMBODIMENTS

Figure 1:
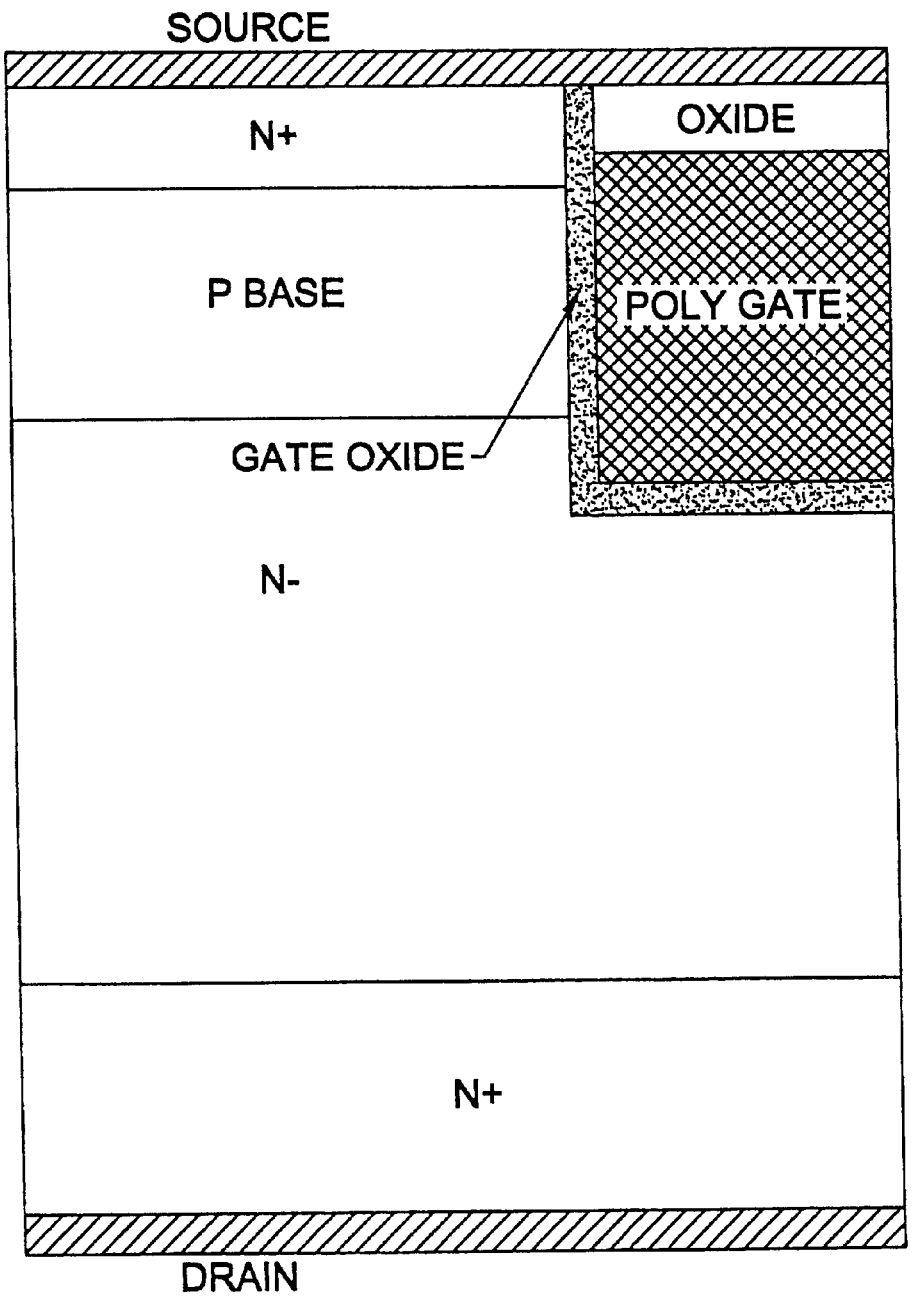
FIG. 1 is a cross-sectional view of a prior art UMOSFET.
Figure 2:
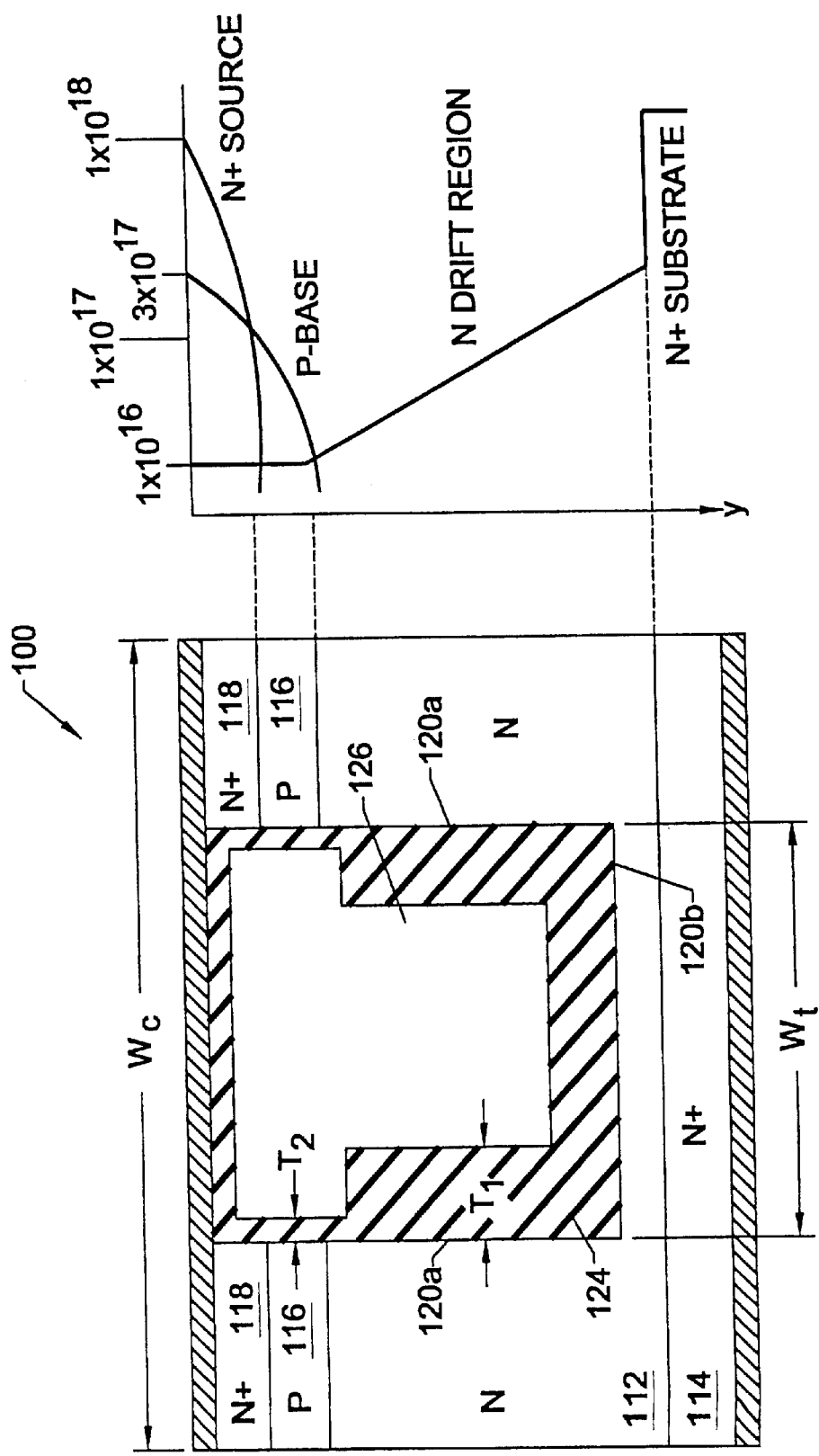
FIG. 2 is a cross-sectional view of a prior art GD-UMOSFET.
Figure 3:
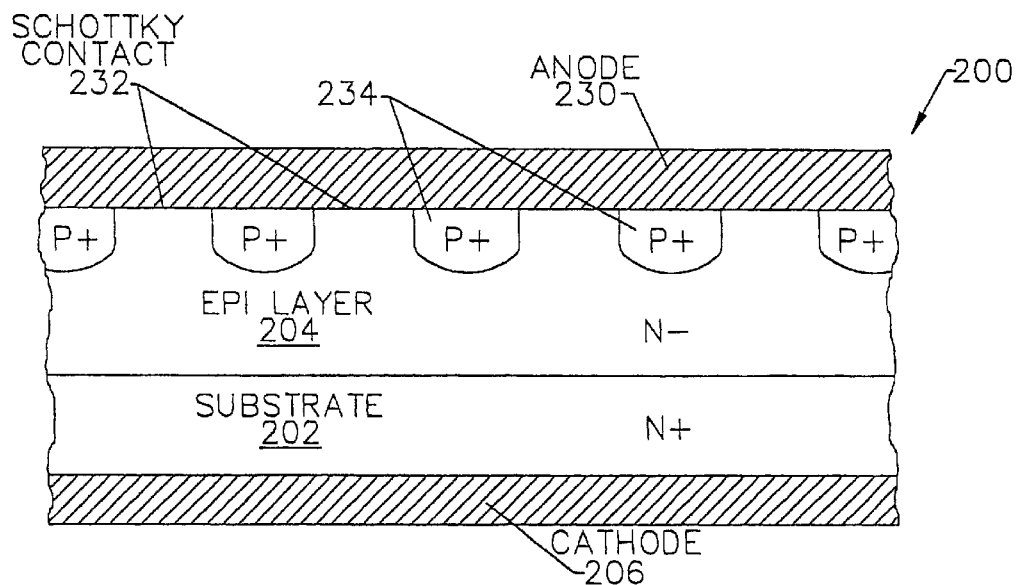
FIG. 3 illustrates a cross-sectional representation of a prior art pinch rectifier, according to FIG. 6 of U.S. Pat. No. 4,641,174.
Figure 4:
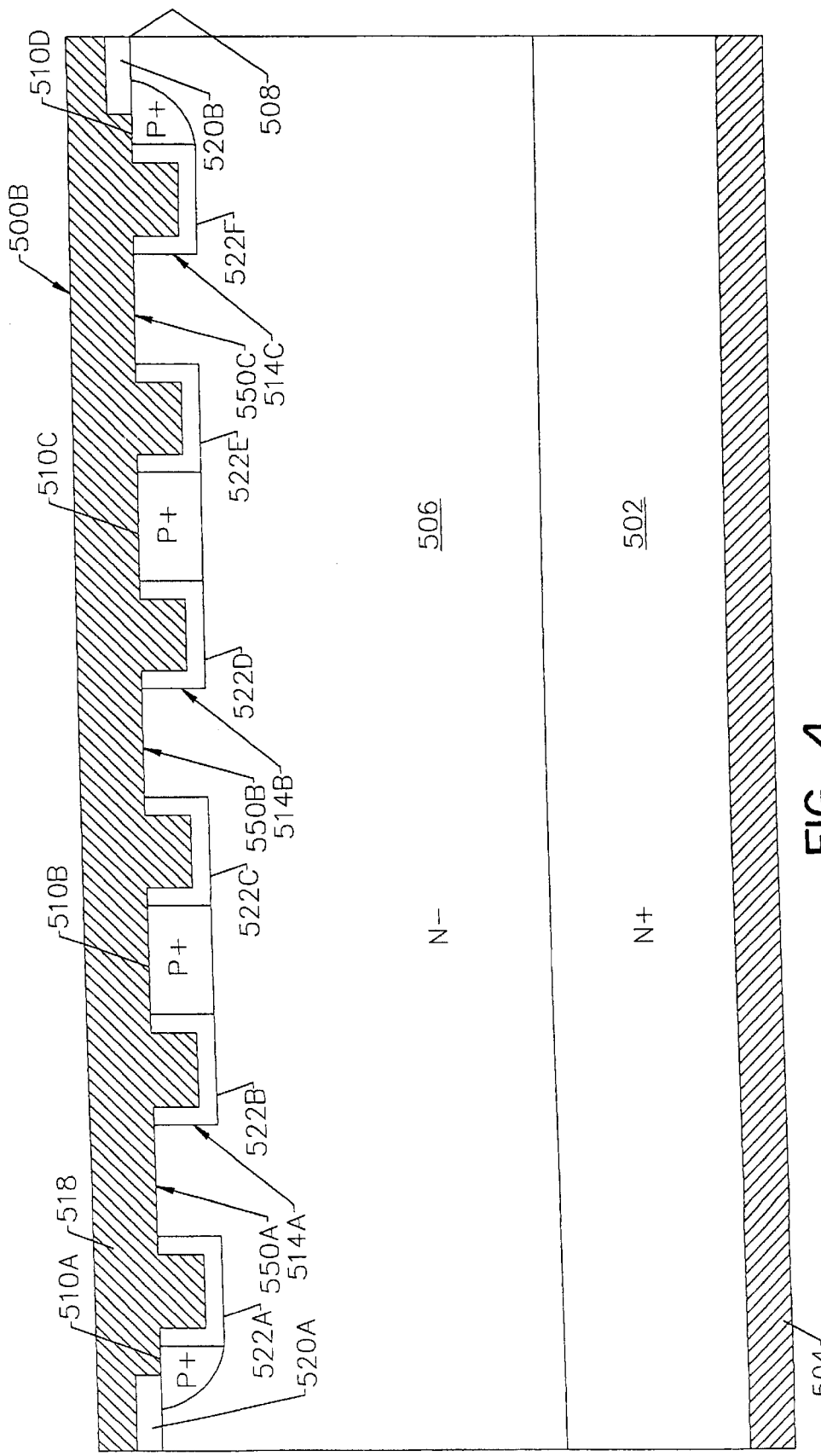
FIG. 4 illustrates a cross-sectional representation of a prior art P-i-N rectifier, according to FIG. 10B of U.S. Pat. No. 4,982,260.
Figure 5:
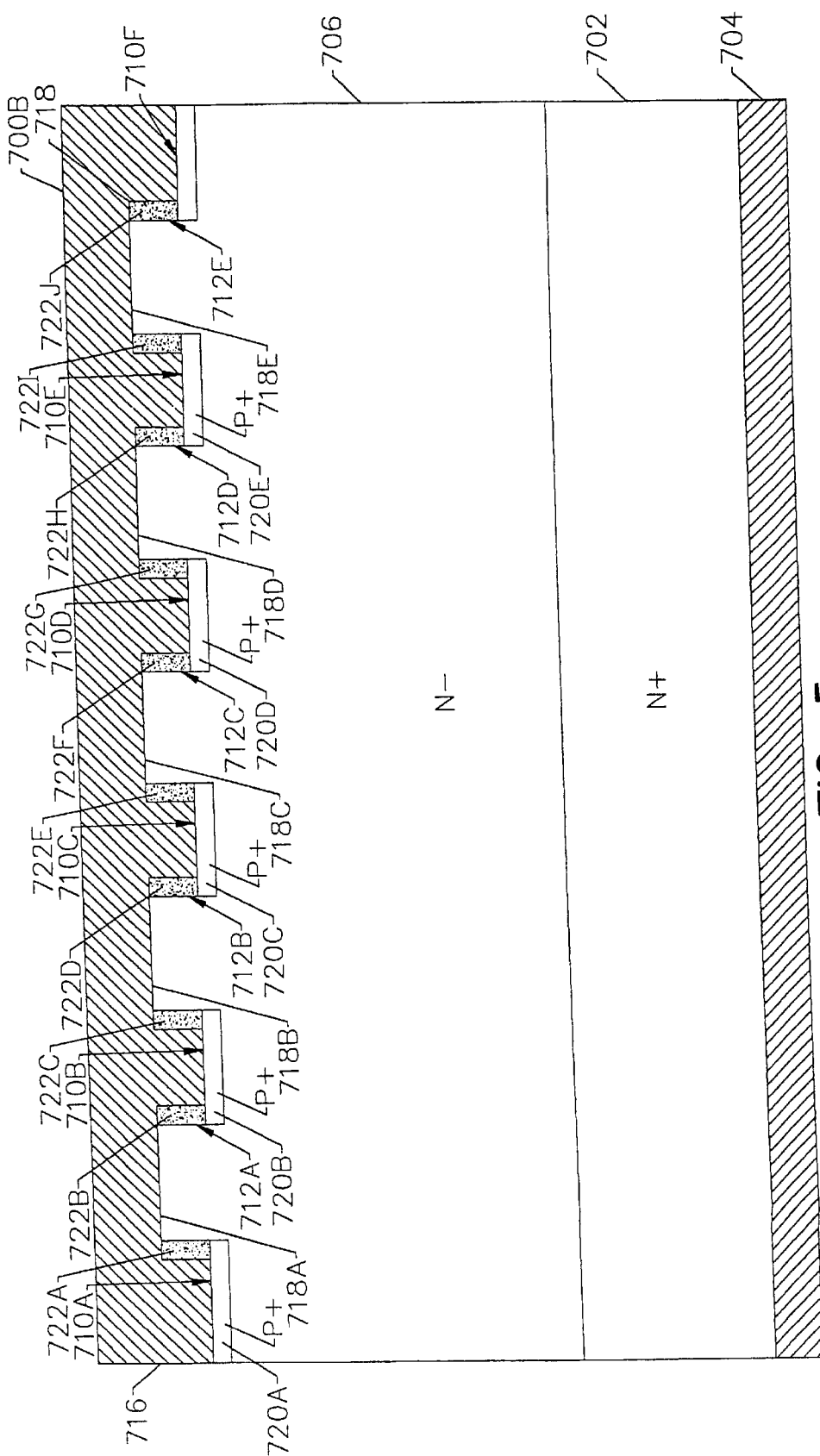
FIG. 5 illustrates a cross-sectional representation of a prior art P-i-N rectifier, according to FIG. 14B of U.S. Pat. No. 4,982,260.
Figure 6:
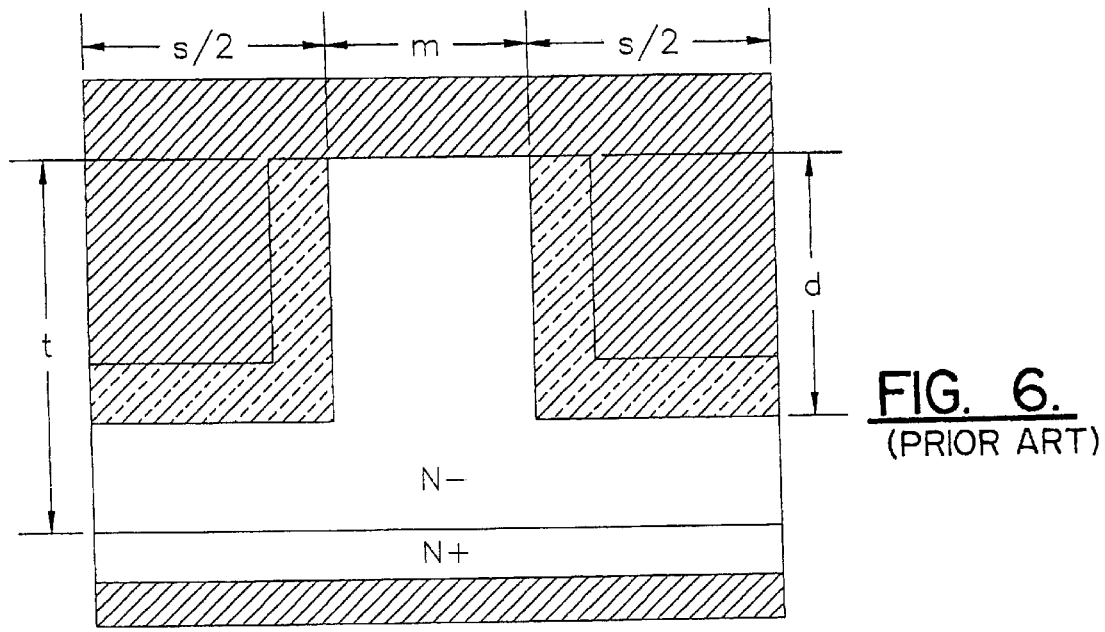
FIG. 6 illustrates a cross-sectional representation of a trench MOS barrier Schottky rectifier (TMBS) according to the prior art.
Figure 7:
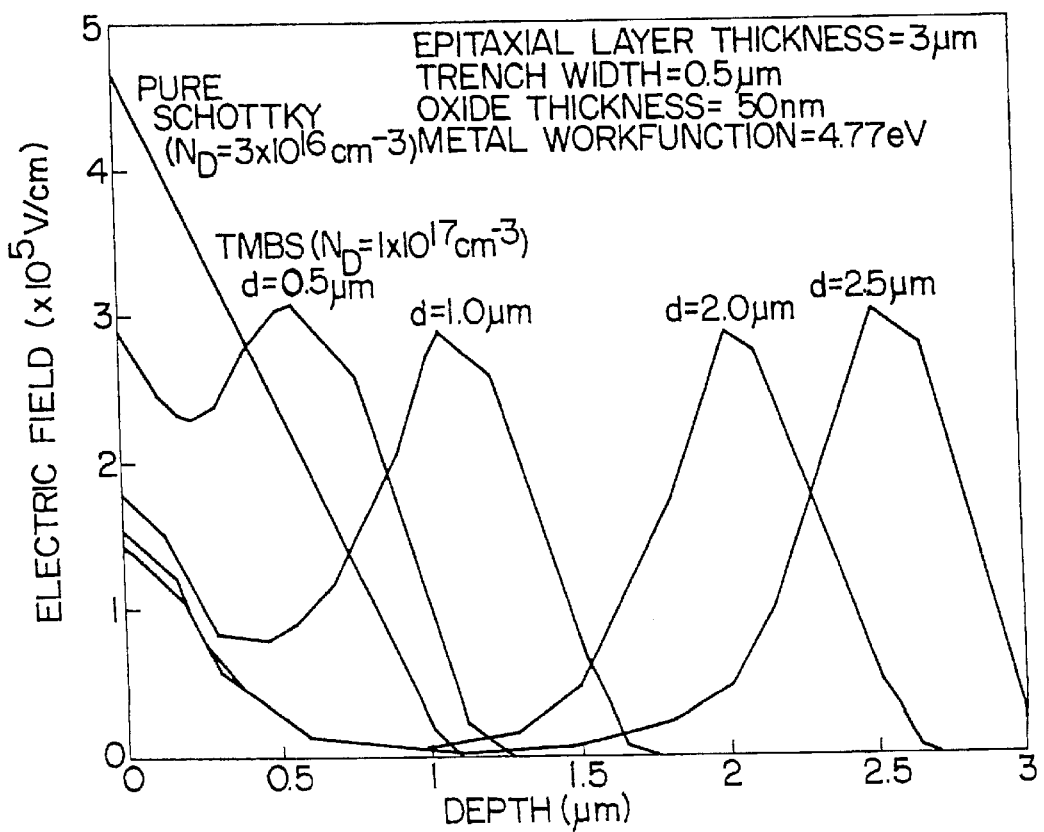
FIG. 7 is a graphical illustration of electric field profiles in an ideal parallel-plane abrupt P-N junction and the TMBS rectifier of FIG. 6, under reverse bias conditions.
Figure 8:
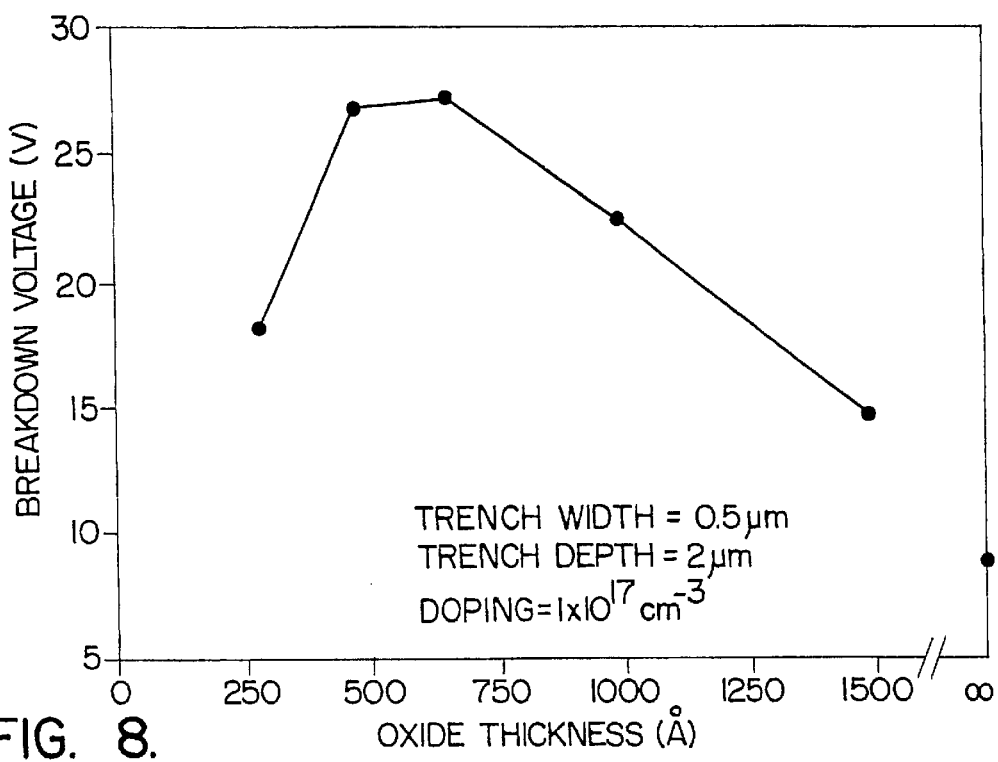
FIG. 8 is a graphical illustration of breakdown voltage versus trench oxide thickness for the TMBS rectifier of FIG. 6.
Figure 9:
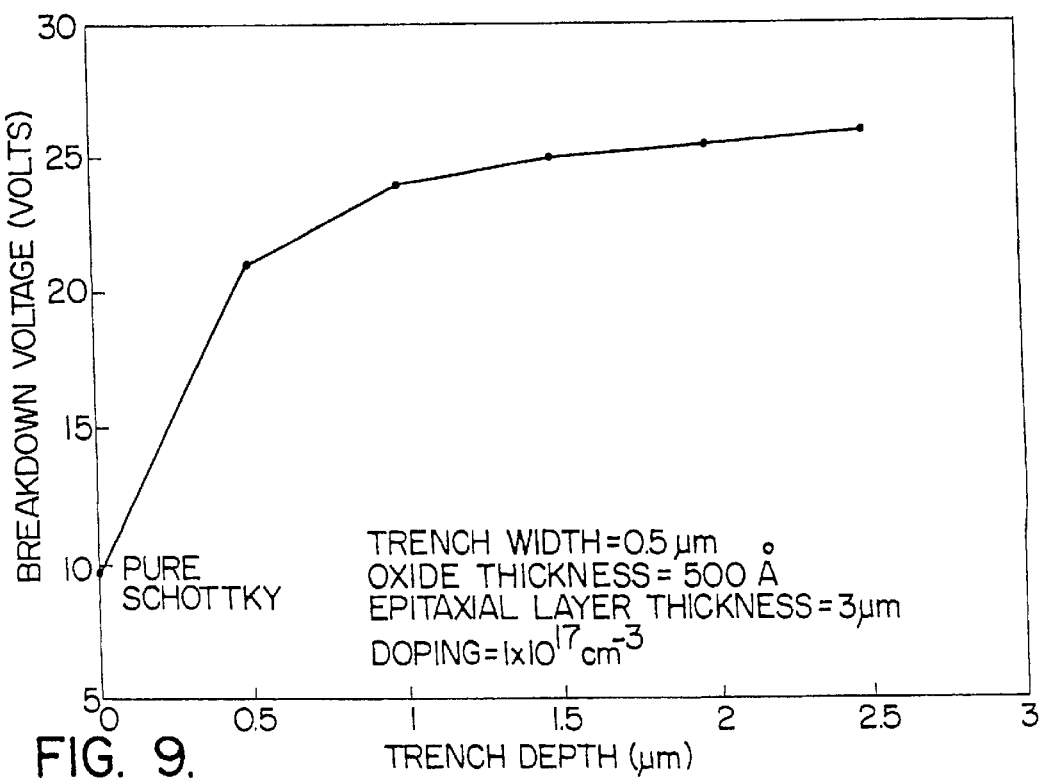
FIG. 9 is a graphical illustration of breakdown voltage versus trench depth for the TMBS rectifier of FIG. 6.
Figure 10B:
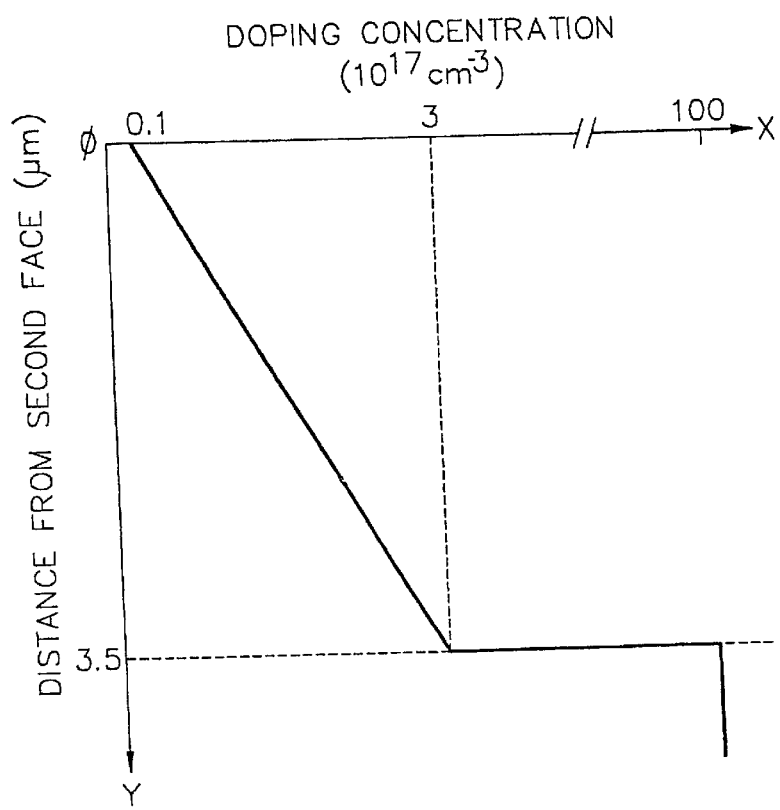
FIG. 10B illustrates the doping concentration in the drift and cathode regions of the Schottky rectifier of FIG. 10A, as a function of distance.
Figure 11:
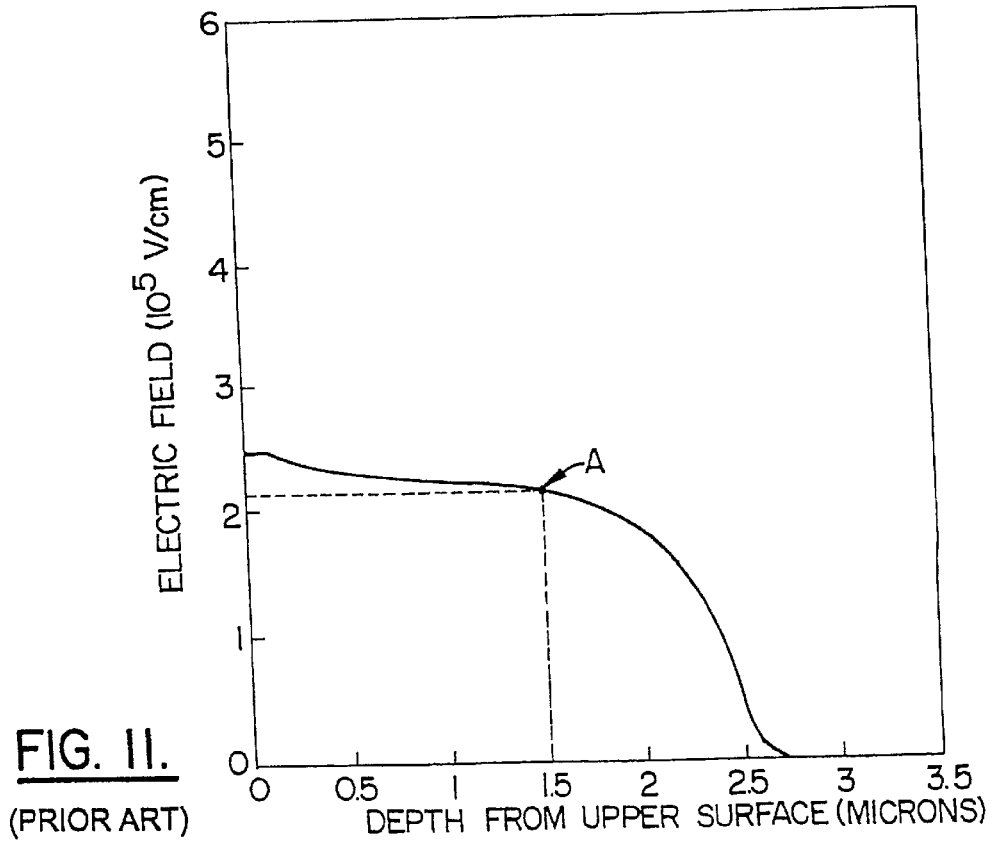
FIG. 11 is a graphical illustration of an electric field profile in the drift region of the Schottky rectifier of FIG. 10A, at the onset of reverse-bias breakdown.
Figure 12:
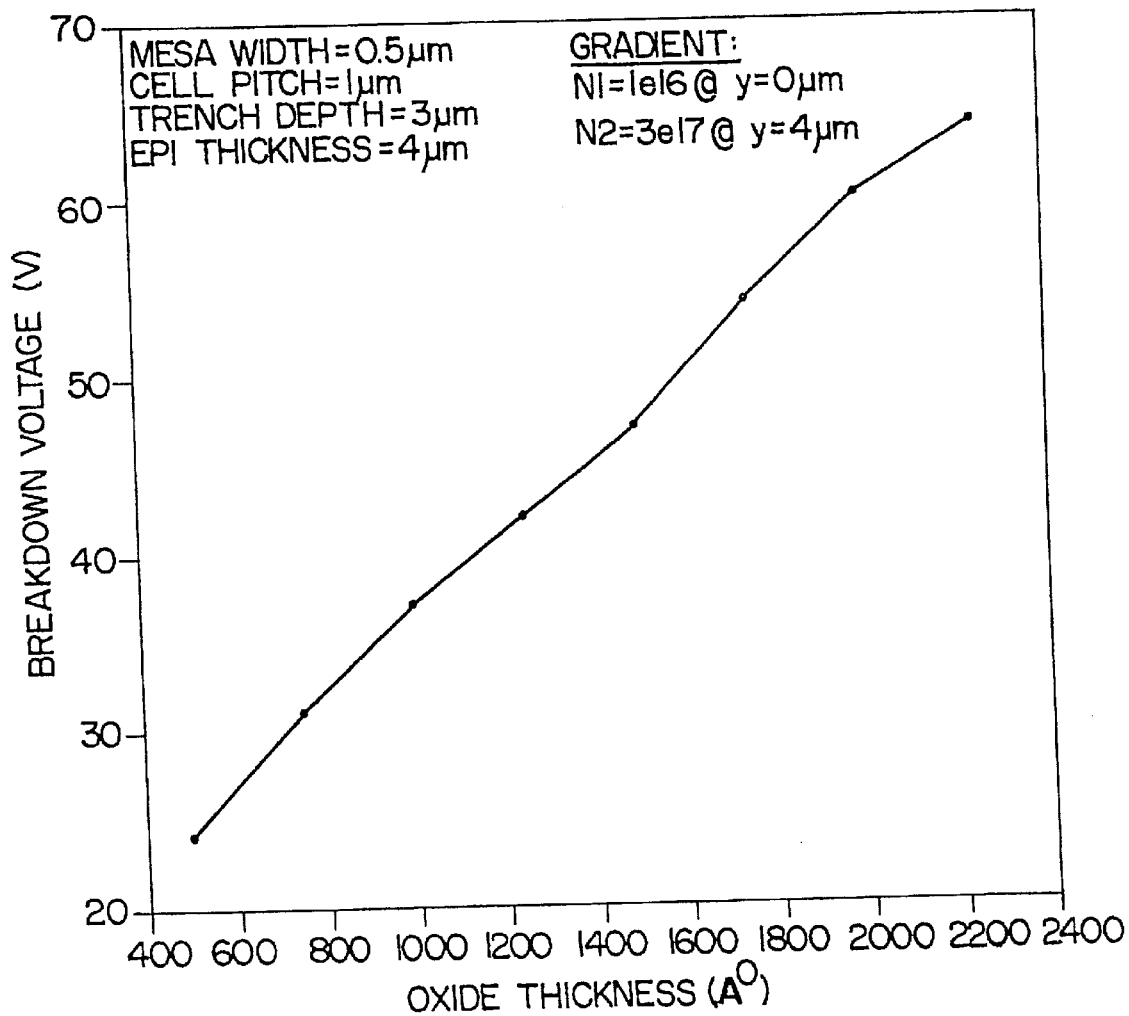
FIG. 12 is a graphical illustration of breakdown voltage versus trench oxide thickness for a Schottky rectifier according to U.S. Pat. No. 5,612,567.
Figure 13:
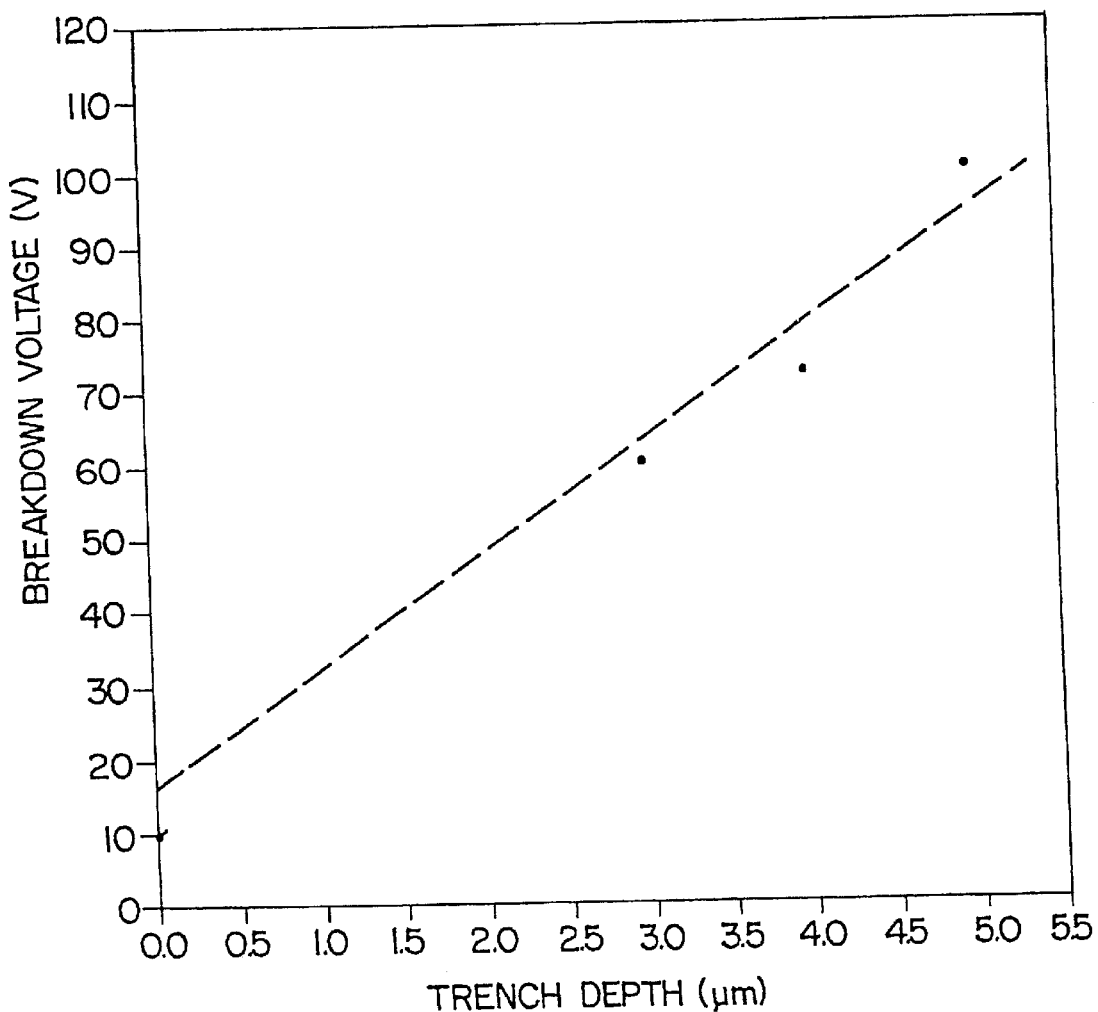
FIG. 13 is a graphical illustration of breakdown voltage versus trench depth for a Schottky rectifier according to U.S. Pat. No. 5,612,567.

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. It will also be understood that when a layer is referred to as being "on" another layer or substrate, it can be directly on the other layer or substrate, or intervening layers may also be present. Moreover, the terms "first conductivity type" and "second conductivity type" refer to opposite conductivity types such as N or P-type, however, each embodiment described and illustrated herein includes its complementary embodiment as well. Like numbers refer to like elements throughout.

Figure 14:
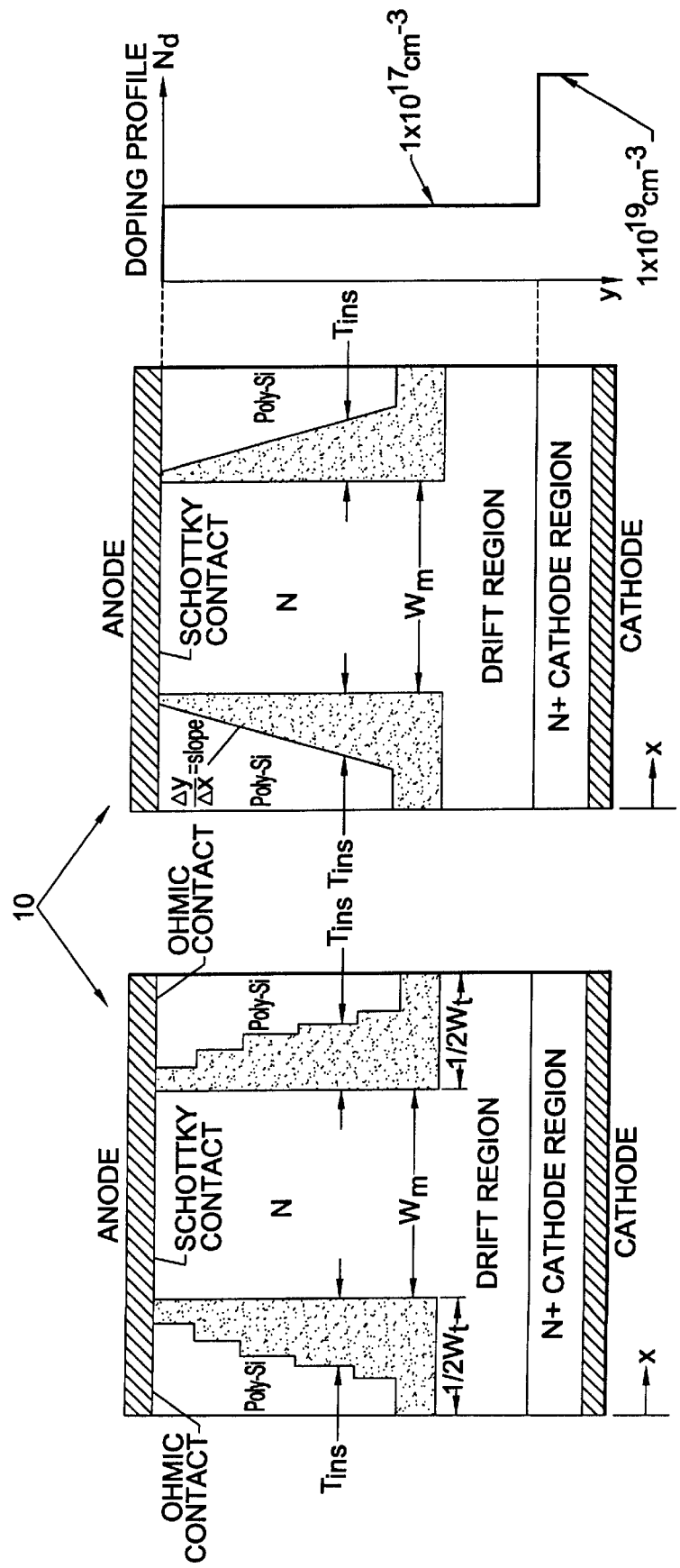
FIG. 14 illustrates cross-sectional views of preferred Schottky barrier rectifiers having step-wise and linear tapered electrically insulating regions therein, according to the present invention.

Referring now to FIG. 14, preferred power devices according to a first embodiment of the present invention will be described. In particular, FIG. 14 illustrates unit cells 10 of preferred Schottky rectifiers, where $W_T$ represents a width of a trench and $W_M$ represents a width of a mesa. As will be understood by those skilled in the art, a plurality of unit cells 10 may be provided side-by-side in an integrated power device. The trenches in an integrated device may also be provided as a plurality of stripe-shaped trenches which extend in parallel in a third dimension (not shown).

Each Schottky rectifier unit cell 10 may comprise a semiconductor substrate having a drift region of first conductivity type (shown as N-type) therein on a more highly doped cathode region (shown as N+). First and second trenches may also be provided side-by-side in the substrate. The first and second trenches have first and second opposing sidewalls, respectively, that define a mesa therebetween into which the drift region extends. According to a preferred aspect of this embodiment, an electrically insulating region (e.g., $SiO_2$) having tapered sidewalls is provided in each of the trenches. As described more fully hereinbelow, the tapered thickness of each of the electrically insulating regions can enhance the degree of uniformity of the electric field along the sidewalls of the trenches and in the mesa and can allow the Schottky rectifier to support higher blocking voltages despite a high concentration of dopants in the drift region (e.g., $\geq 1 \times 10^{17}$ $cm^{-3}$).

In particular, the electrically insulating region that lines the first sidewall of the first trench preferably has a nonuniform thickness $T_{ins}(y)$ in a range between about 0.5 and 1.5 times $T_{ideal}(y)$, where:

$$T_{ideal}(Y)|_{y \geq \alpha} = \epsilon_{ins}((2\epsilon_s E_{cr}/qW_m N_d)(y-\alpha) - \tfrac{1}{4} W_m)/\epsilon_s$$

and $\epsilon_{ins}$ is the permittivity of the electrically insulating region ($\epsilon_{SiO2}$=3.85), $\epsilon_s$ is the permittivity of the drift region ($\epsilon_{Si}$=11.7), $E_{cr}$ is the breakdown electric field strength of the drift region ($E_{cr}$(silicon)=$2 \times 10^5$ V/cm), q is the electron charge, $N_d$ is the first conductivity type doping concentration in the drift region (e.g., $1.5 \times 10^{17}$ $cm^{-3}$), $W_m$ is a width of the mesa (0.5 $\mu$m), y is the depth (relative to a top of the first trench) at which the thickness of the electrically insulating region is being determined and a is a constant that equals zero for the embodiment of FIG. 14. Based on the specified parameters for silicon, a determination of $T_{ins}(y)$ (relative to a sidewall of the trench) at various depths yields a preferred slope in a range between about 500 Å/$\mu$m and 1500 Å/$\mu$m, and more preferably about 1100 Å/$\mu$m.

Referring still to FIG. 14, an electrode (e.g., poly-Si) is also provided in the first trench and is electrically insulated from the sidewalls and bottom of the first trench by the electrically insulating region. This electrode forms an ohmic contact with an anode electrode. The anode electrode also forms a Schottky rectifying junction with the portion of the drift region extending into the mesa. As illustrated by the unit cells 10 of FIG. 14, the nonuniform thickness of the electrically insulating region may manifest itself as a linear taper (right side), a curvilinear taper (not shown) or a multiple step-wise taper (left side) that extends outwardly relative to a bottom of the first trench at a nonzero average slope relative to the sidewall of the first trench. Moreover, based on the preferred slope of the tapered sidewalls in accordance with equation (1), a product of a width of the mesa and the first conductivity type dopant concentration in the drift region is preferably set at a level in a range between about $5 \times 10^{12}$ $cm^{-2}$ and $7.5 \times 10^{12}$ $cm^{-2}$ to provide optimum charge coupling for creating a uniform electric field. Thus, the drift region may be uniformly doped at a high level in excess of $1 \times 10^{17}$ $cm^{-3}$ so that the on-state resistance of the power device can be maintained at a low level.

Figure 15:
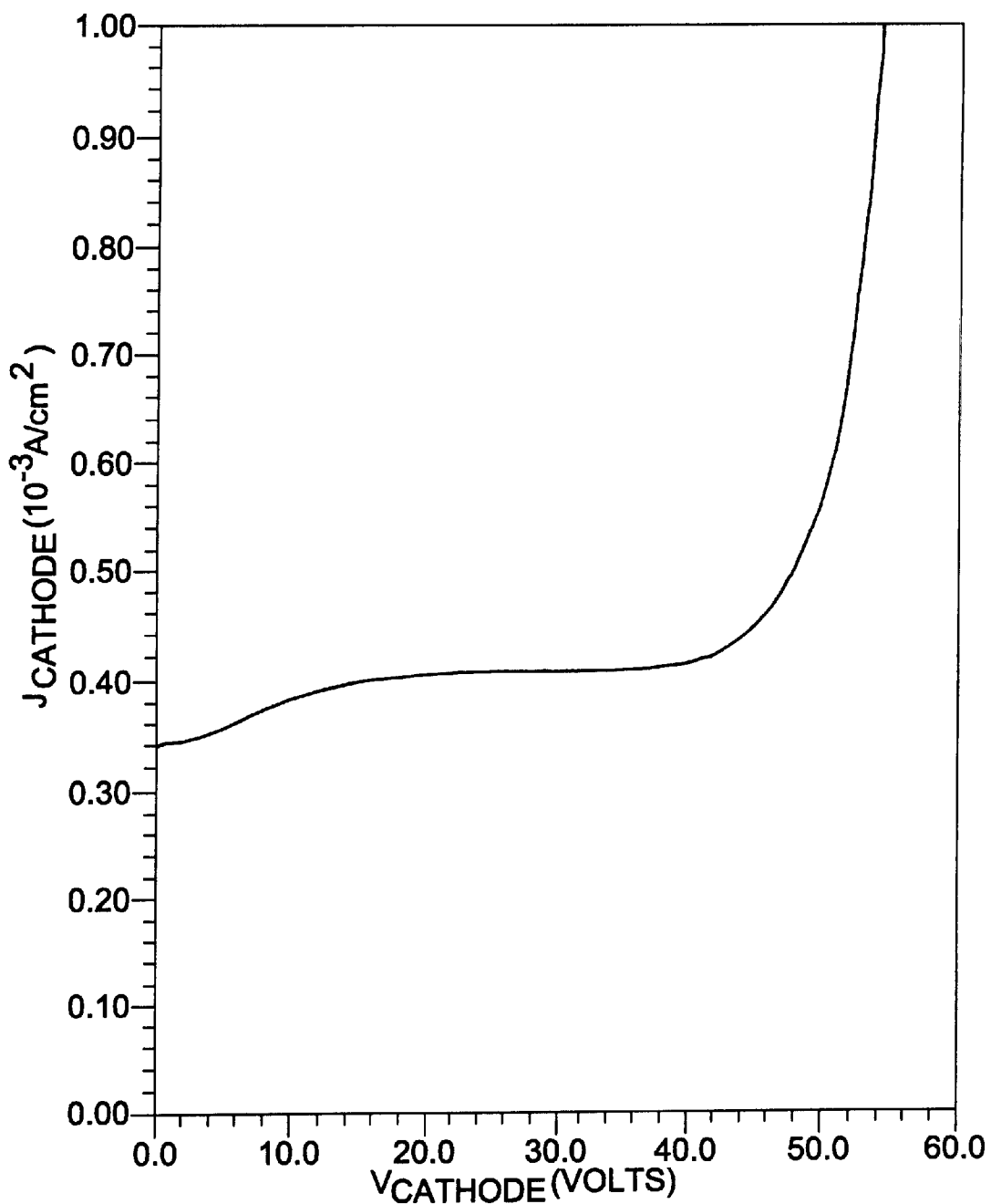
FIG. 15 is a graph that illustrates simulated reverse I-V characteristics of a Schottky rectifier according to an embodiment of FIG. 14.
Figure 16:
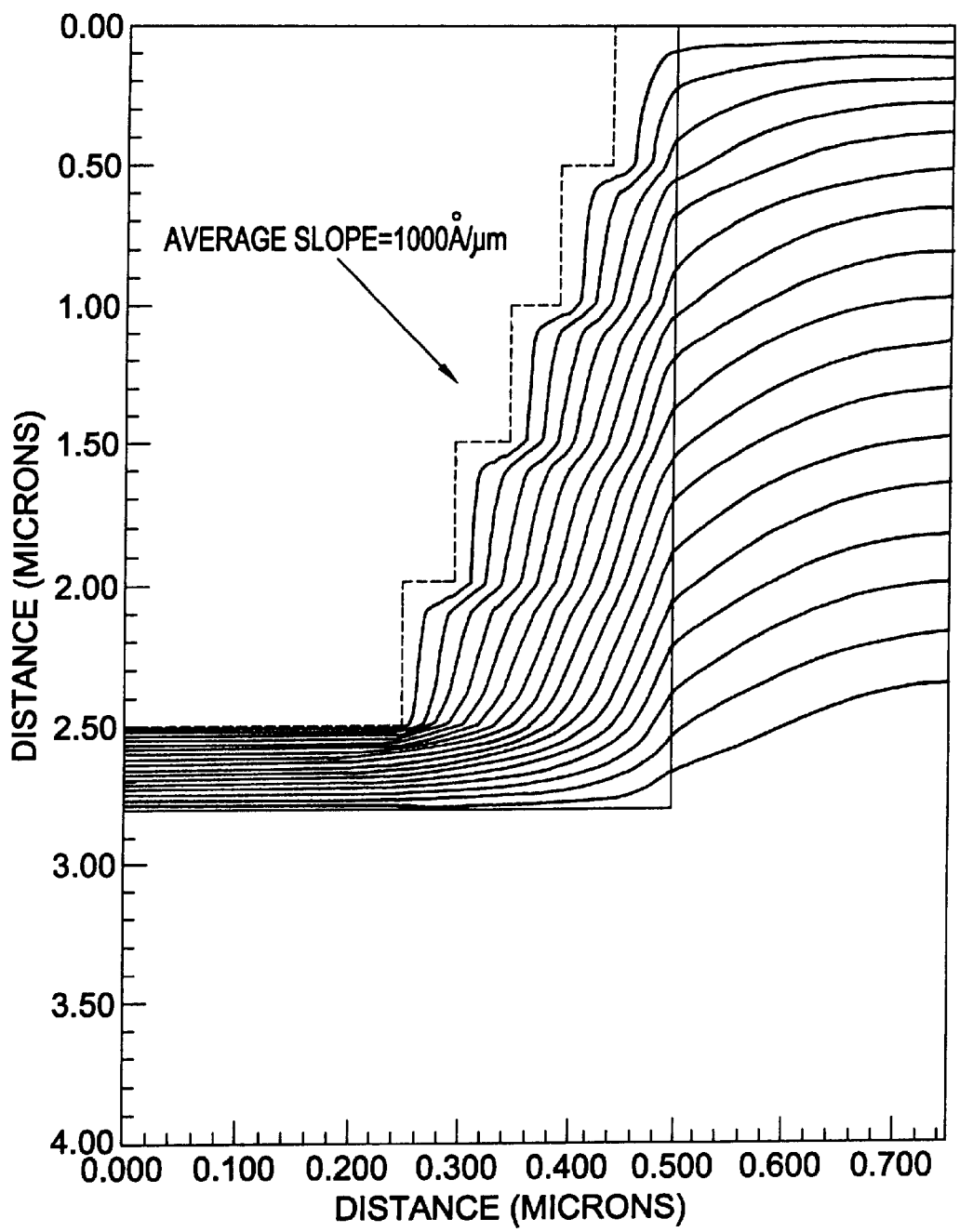
FIG. 16 is a graph that illustrates simulated potential contours in the Schottky rectifier of FIG. 14 having a step-wise tapered electrically insulating region, at a reverse bias of 35 volts.
Figure 17:
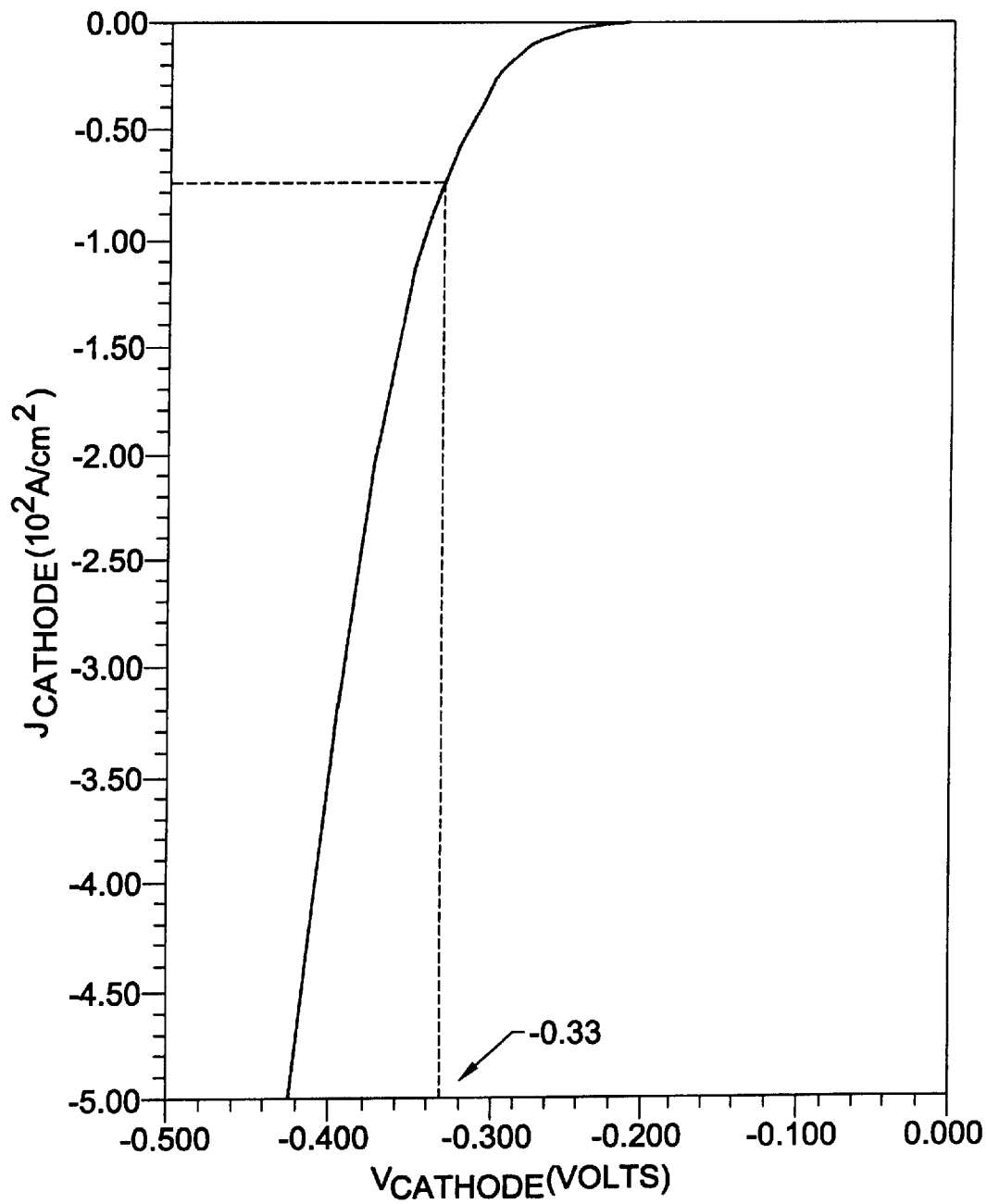
FIG. 17 is a graph that illustrates forward on-state I-V characteristics of a Schottky rectifier according to the embodiment of FIG. 14.

Numerical simulations were performed to illustrate the operation of the device of FIG. 14. For these simulations, the work-function for the Schottky barrier contact was set at 4.8 eV and the trench depth was set at 2.8 $\mu$m for a drift region thickness of 3 $\mu$m. The half-widths of the mesa and trenches were chosen at 0.25 $\mu$m and 0.5 $\mu$m, respectively, leading to a half-cell pitch of 0.75 $\mu$m. The first conductivity type doping concentration in the drift region was also set at $1 \times 10^{17}$ $cm^{-3}$. The electrically insulating region on the sidewall of the trench was specified as an oxide having a step-wise taper with 5 steps at an average slope of 1000 Å/$\mu$m relative to the sidewall of the trench. Based on these parameters, the simulated breakdown voltage for the device of FIG. 14 was determined to be about 50 volts, as illustrated by FIG. 15. FIG. 15 also illustrates that the reverse leakage current in the device remains almost independent of reverse bias until about 40 volts, which is beneficial at keeping reverse power losses at low levels. The potential distribution within the simulated device under a reverse bias of 35 volts is also illustrated by FIG. 16. Based on FIG. 16, it can be seen that the potential contours are evenly spaced over most of the drift region and indicate a nearly ideal voltage distribution in the mesa. Simulations also predict a maximum electric field at the Schottky contact of only $3.5 \times 10^5$ V/cm, which is about half that for a conventional planar Schottky rectifier. The nature of the potential contours and field distribution also demonstrate that the breakdown voltage can be scaled linearly with increasing trench depth. The simulated on-state I-V characteristics also predict an on-state voltage drop of 0.33 volts at a forward current density of 100 A/$cm^2$, as illustrated by FIG. 17. In contrast, simulations of a prior art TMBS rectifier having the same mesa characteristics predict identical on-state I-V characteristics but at a much lower breakdown voltage of 25 volts. Simulations of a prior art GD-TMBS rectifier predict a higher on-state voltage drop of about 0.4 volts for the same blocking voltage due to a lower average doping concentration in the mesa.

Figure 18:
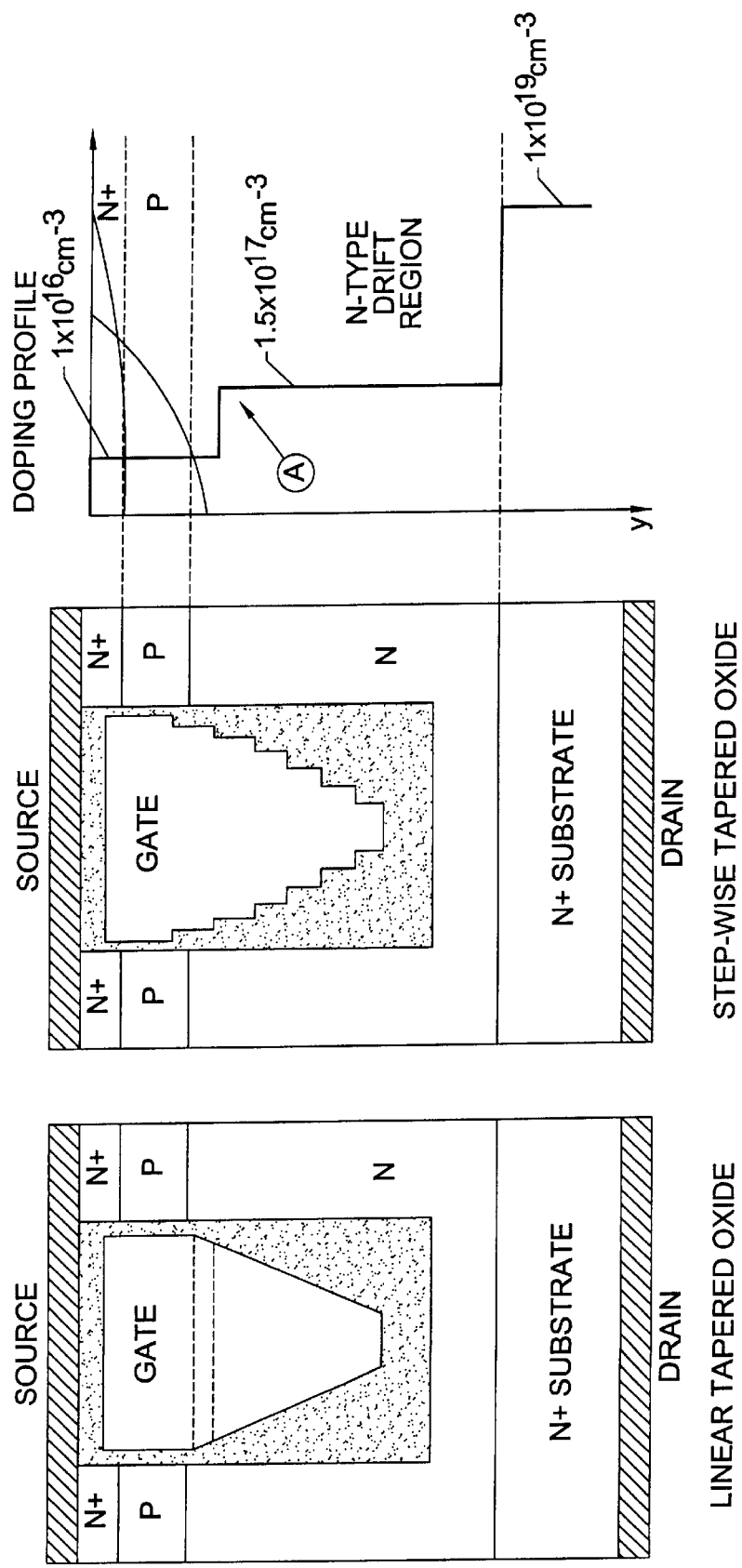
FIG. 18 illustrates cross-sectional views of preferred vertical MOSFETs having linear and step-wise tapered electrically insulating regions therein, according to the present invention.

Referring now to FIG. 18, preferred vertical MOSFETs according to another embodiment of the present invention will be described. In particular, FIG. 18 illustrates cross-sectional views of a pair of preferred vertical MOSFETs having linear and step-wise tapered electrically insulating regions therein. In both these devices, the doping concentration in the drift region is essentially maintained at a constant level in a range between $1.0 \times 10^{17}$ $cm^{-3}$ and $1.5 \times 10^{17}$ $cm^{-3}$ for a mesa width of 0.5 $\mu$m. This doping concentration level and mesa width correspond to a total mesa charge of $5.0 \times 10^{12}$–$7.5 \times 10^{12}$ $cm^{-2}$.

Like the embodiment of FIG. 14, the electrically insulating region that lines the sidewall of the trench preferably has a nonuniform thickness $T_{ins}(y)$ in a range between about 0.5 and 1.5 times $T_{ideal}(y)$, wherein $T_{ideal}(y)$ is as specified in equation (1) and α equals the depth of the P-N junction formed between the P-type base region and the N-type drift region. Based on the above-specified parameters for silicon and a total mesa charge of $7.5 \times 10^{12}$ cm$^{-2}$, a determination of $T_{ins}(y)$ (relative to a sidewall of the trench) at various depths yields a preferred slope in a range between about 500 Å/μm and 1500 Å/μm, and more preferably about 1100 Å/μm.

Figure 19:
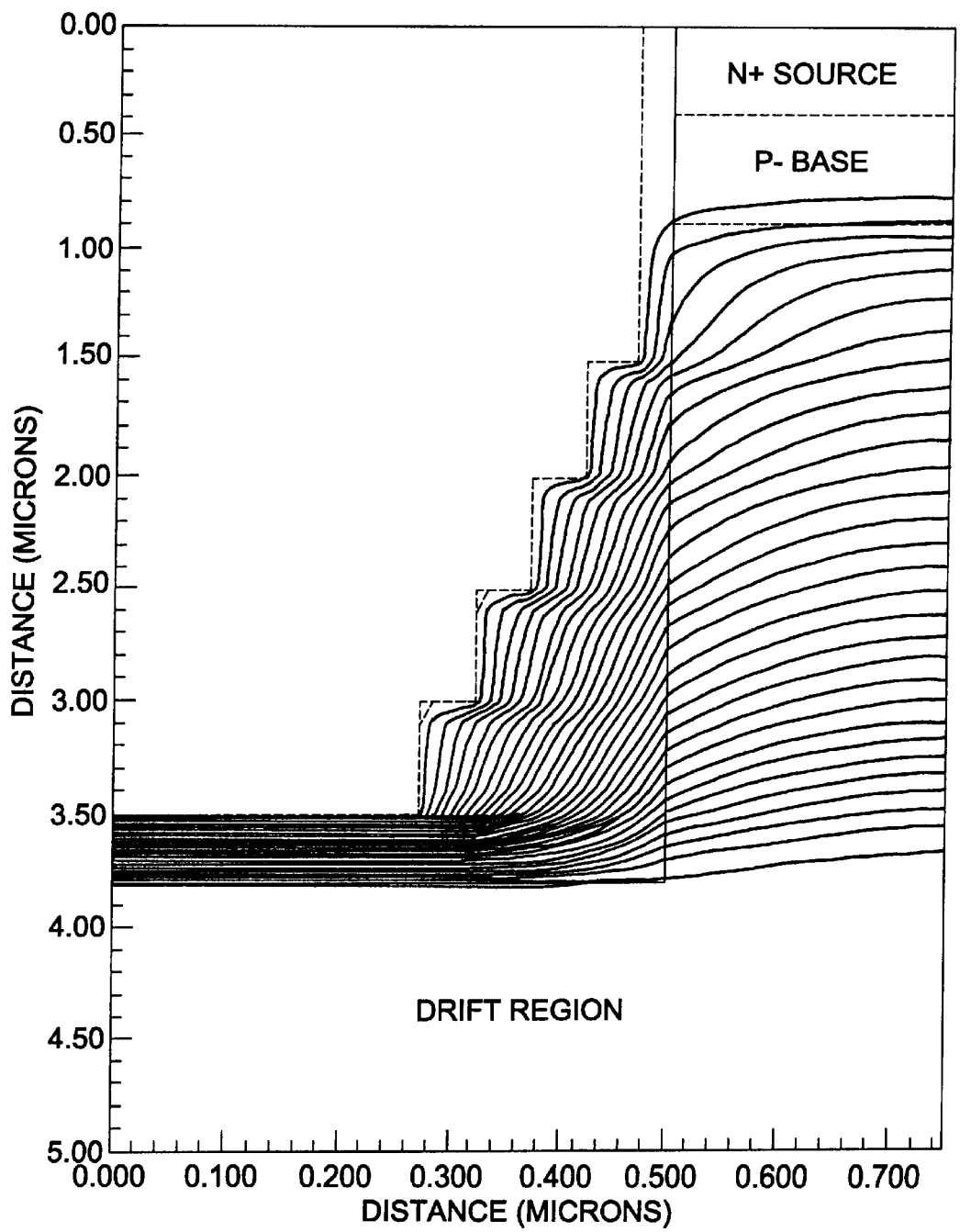
FIG. 19 is a graph that illustrates simulated potential contours in the vertical MOSFET of FIG. 18 having a step-wise tapered electrically insulating region therein, at a drain bias of 60 volts and a gate bias of 0 volts.
Figure 20:
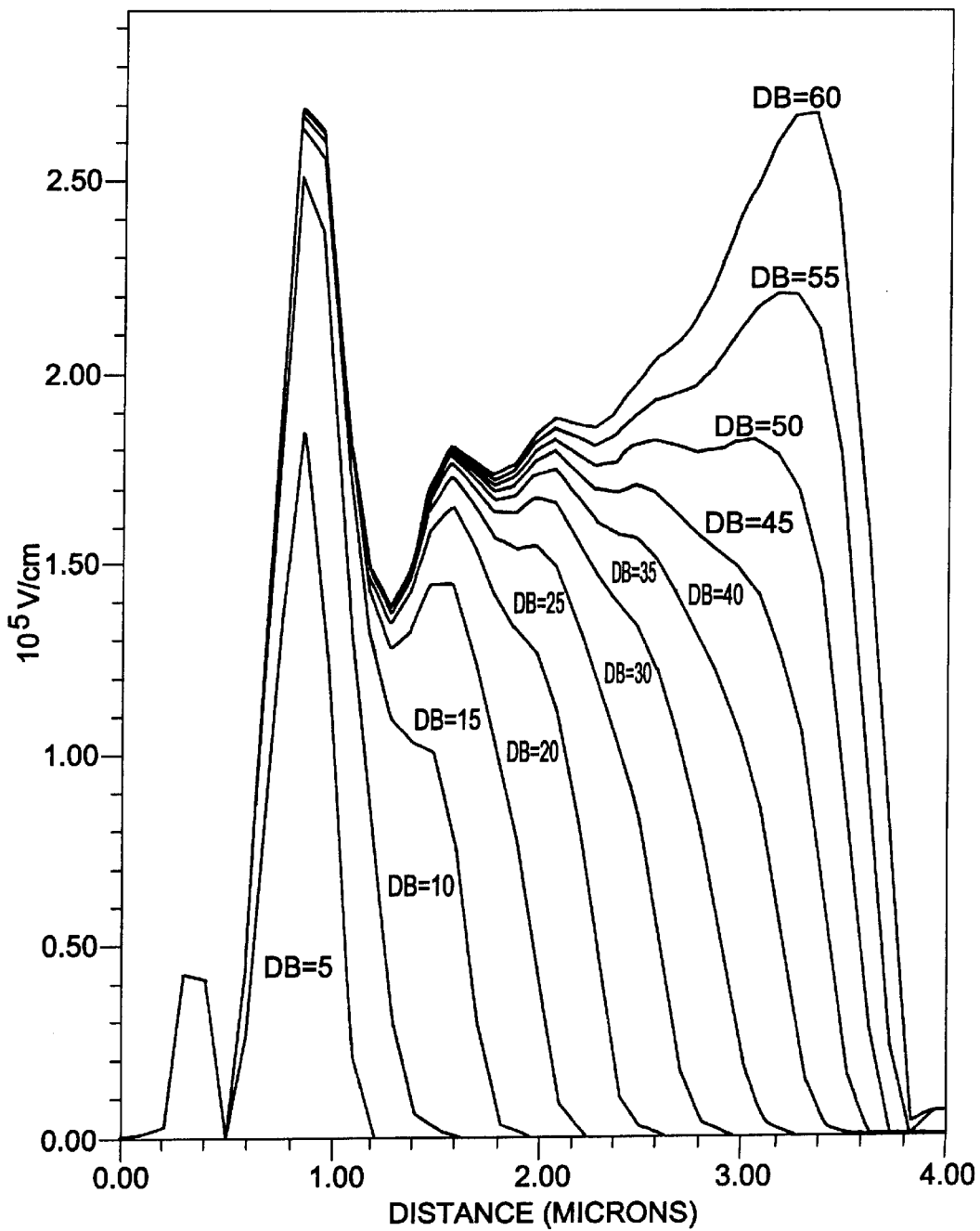
FIG. 20 is a graph that illustrates simulated electric field profiles in the vertical MOSFET of FIG. 18, at various drain biases. The graph's y-axis specifies the magnitude of the electric field at the center of the mesa and the x-axis specifies the depth into the mesa.

Numerical simulations were performed to illustrate the operation of the device of FIG. 18. For these simulations, the trench depth was set at 2.8 μm for a drift region thickness of 3 μm. The half-widths of the mesa and trenches were chosen at 0.25 μm and 0.5 μm, respectively, leading to a half-cell pitch of 0.75 μm. The first conductivity type doping concentration in the drift region was also set at $1.5 \times 10^{17}$ cm$^{-3}$. The P-base/N-drift and N+ source/P-base junction depths were 0.9 and 0.4 μm, respectively, resulting in a channel length of 0.5 μm. The electrically insulating region on the sidewall of the trench was also specified as an oxide having a step-wise taper with 5 steps at an average slope of 1000 Å/μm relative to the sidewall of the trench. The thickness of the portion of the oxide extending opposite the P-base (i.e., gate oxide) was 250 Å. Based on these parameters, the device of FIG. 18 was able to support a reverse bias of over 60 volts. FIG. 19 also illustrates the simulated potential contours in the device of FIG. 18 having a step-wise tapered electrically insulating region therein, at a drain bias of 60 volts and a gate bias of 0 volts. As illustrated by FIG. 19, the potential contours are evenly spaced over most of the drift region and indicate a nearly ideal voltage distribution in the mesa. A simulation of the change in electric field with increasing drain bias is provided by FIG. 20. As illustrated by FIG. 20, the electric field initially appears across the P-base/N-drift junction in triangular form. However, as the drain bias increases, the charge coupling with the gate electrode in the trench leads to a spreading of the electric field downwards with a maximum field between 1.5 and $2 \times 10^5$ V/cm. The field spreads at the bottom of the trench (located at 3 microns) at a drain bias of 50 volts. At higher drain bias voltages, the electric field begins to increase at the bottom of the trench. This increase in field eventually leads to a breakdown at just above 60 volts. The nature of the potential contours and field distribution also demonstrate that the breakdown voltage can be scaled linearly with increasing trench depth. Accordingly, devices with different breakdown voltages can be fabricated using the same process (e.g., same trench depth) on wafers having uniformly doped epitaxial/drift regions of different thickness. Nonetheless, as illustrated by FIG. 18, it is preferable that the doping concentration profile in the drift region has a discontinuity at point "A" so that excessive compensation is not necessary to achieve the desired concentration of second conductivity type dopants in the base region (shown as P-type).

Simulations of the on-state I-V characteristics were also performed using a gate oxide thickness of 250 Å. These simulations revealed a very low specific on-resistance of 58 micro-Ohm cm$^2$ which is about sixteen times better than that for a conventional UMOSFET device and about two times better than that for the GD-UMOSFET device. The use of trench-based insulating regions having tapered sidewalls may also be extended to UMOSFETs having buried source electrodes. For example, as illustrated by the embodiment of FIG. 18 having the linear tapered oxide, the gate electrode at the top of the trench may be electrically isolated from a buried source electrode at a bottom of the trench. This electrical isolation is provided by an intermediate insulating region which extends across the trench, as illustrated by the dotted lines. Preferred power devices having buried source electrodes are more fully described in U.S. application Ser. No. 09/178,845, filed Oct. 26, 1998, entitled "Power Semiconductor Devices Having Improved High Frequency Switching and Breakdown Characteristics", now U.S. Pat. No. 5,998,833, the disclosure of which is hereby incorporated herein by reference.

The devices of FIG. 18 can be formed from silicon wafers having two uniformly doped epitaxial layers thereon. The P-base and N+ source regions and trenches can also be formed using conventional techniques. A step-wise tapered oxide structure can be fabricated using multiple steps including poly-refill followed by planarization to each step height and then thinning the oxide at each stage. These steps would then be followed by the growth of the gate oxide and the final gate polysilicon deposition and planarization. For example, after formation of a trench, a step can be performed to line the sidewalls and bottom of the trench with a relatively thick electrically insulating layer. Next, a first polysilicon region can be deposited into the trench and then a planarization step can be performed to selectively etchback the deposited first polysilicon region to a desired thickness at the bottom of the trench. An oxide thinning step can then be performed to thin those portions of the electrically insulating layer not covered by the first polysilicon region. After the oxide thinning step, a second polysilicon region can be deposited onto the etched-back first polysilicon region. This second polysilicon region can then be etched-back to a desired thickness. Another oxide thinning step can then be performed to thin those portions of the electrically insulating layer not covered by the second polysilicon region. The above sequence of steps is then repeated until the desired step-wise profile of the sidewall insulating region is achieved. A high quality gate oxide can then be growth on the portion of the sidewall extending opposite the base region. A final gate polysilicon deposition step and planarization step can then be performed using conventional techniques to complete the gate electrode structure.

Alternatively, a oxide having a linear (or curvilinear) tapered sidewall can be formed by first lining a bottom and sidewalls of the trench with an electrically insulating layer. Next, the trench is filled with a sacrificial electrically conductive region (e.g., polysilicon). A step is then performed to etch the electrically insulating layer at a first rate while simultaneously etching the sacrificial electrically conductive region at a second rate greater than the first rate (e.g., 10:1), so that the electrically insulating layer has tapered sidewalls that extend outwardly, relative to the bottom of the trench. During this etching step, all the sacrificial electrically conductive region may be removed. Those skilled in the art would also appreciate that other fabrication techniques can be performed to yield trench-based electrically insulating regions having the preferred sidewall profiles described above.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. A power semiconductor device, comprising:

a semiconductor substrate having a drift region of first conductivity type therein;

a first trench and a second trench in said semiconductor substrate, said first and second trenches defining a drift region mesa of first conductivity type therebewteen that has a uniform lateral doping concentration therein extending from a sidewall of the first trench to an opposing sidewall of the second trench;

an electrically insulating region on a sidewall of said first trench, said electrically insulating region having a tapered sidewall that extends outwardly relative to a bottom of said first trench at an average slope in a range between about 500 Å/μm and 1,500 Å/μm relative to the sidewall of said first trench; and an electrode on the tapered sidewall of said electrically insulating region;

wherein the drift region mesa has a uniform vertical doping concentration therein at a level greater than about $1 \times 10^{17}/cm^{-3}$; and wherein a product of a width of the drift region mesa and the first conductivity type doping concentration in the drift region is in a range between about $5 \times 10^{12}$ $cm^{-2}$ and $7.5 \times 10^{12}$ $cm^{-2}$.

2. The device of claim 1, wherein the drift region extends to a surface of said semiconductor substrate; and wherein said electrode is electrically connected to an anode electrode that forms a Schottky rectifying junction with the drift region at the surface.

3. The device of claim 1, further comprising:

a base region of second conductivity type in said semiconductor substrate, said base region forming a first P-N rectifying junction with the drift region that extends to the sidewall of said first trench; and a source region of first conductivity type in said semiconductor substrate, said source region forming a second P-N rectifying junction with said base region that extends to the sidewall of said first trench.

4. The device of claim 3, wherein the sidewall of said first trench defines an interface between said base region and said electrically insulating region; wherein the tapered sidewall of said electrically insulating region extends opposite said base region; and wherein a first thickness of said electrically insulating region at a location extending opposite the first P-N rectifying junction is greater than a second thickness of said electrically insulating region at a location extending opposite the second P-N rectifying junction.

5. The device of claim 3, further comprising an insulated gate electrode in said first trench, extending opposite said base region; wherein said electrode comprises a buried source electrode that extends between said insulated gate electrode and a bottom of said first trench; and wherein said buried source electrode is electrically connected to said source region.

6. A power semiconductor device, comprising:

a semiconductor substrate having a drift region of first conductivity type therein;

first and second trenches in said substrate, said first and second trenches having first and second opposing sidewalls, respectively, that define a mesa therebetween into which the drift region extends;

an electrically insulating region lining the first sidewall of said first trench and having a nonuniform thickness $T_{ins}(y)$ in a range between about 0.5 and 1.5 times $T_{ideal}(y)$, where:

$$T_{ideal}(y)|_{y \geq \alpha} = \epsilon_{ins}((2\epsilon_s E_{cr}/qW_m N_d)(y-\alpha)-\frac{1}{4}W_m)/\epsilon_s$$

and $\epsilon_{ins}$ is the permittivity of the electrically insulating region, $\epsilon_s$ is the permittivity of the drift region, $E_{cr}$ is the breakdown electric field strength of the drift region, q is the electron charge, $N_d$ is the first conductivity type doping concentration in the drift region, $W_m$ is a width of the mesa, y is the depth, relative to a top of said first trench, at which the thickness of the electrically insulating region is being determined and α is a constant; and an electrode on said electrically insulating region.

7. The power semiconductor device of claim 6, further comprising an anode electrode that forms a Schottky rectifying junction with said mesa and is electrically connected to said electrode within said first trench.

8. The power semiconductor device of claim 6, further comprising:

a base region of second conductivity type in said semiconductor substrate, said base region forming a first P-N rectifying junction with the drift region that extends to the first sidewall of said first trench; and a source region of first conductivity type in said semiconductor substrate, said source region forming a second P-N rectifying junction with said base region that extends to the first sidewall of said first trench; and wherein a equals a depth of the first P-N rectifying junction.

9. The device of claim 8, further comprising an insulated gate electrode in said first trench, extending opposite said base region; wherein said electrode comprises a buried source electrode that extends between said insulated gate electrode and a bottom of said first trench; and wherein said buried source electrode is electrically connected to said source region.

* * * * *

UNITED STATES PATENT AND TRADEMARK OFFICE
CERTIFICATE OF CORRECTION

PATENT NO. : 6,191,447 B1
DATED : February 20, 2001
INVENTOR(S) : Bantval Jayant Baliga It is certified that error appears in the above-identified patent and that said Letters Patent is hereby corrected as shown below:

<u>Title page,</u>
Item [57], ABSTRACT,
Line 17, please change "$\alpha)-1/4$" to -- $\alpha)+1/4$ --

<u>Column 10,</u>
Line 51, please change "$(y-\alpha)-$" to -- $(y-\alpha)+$ --

<u>Column 13,</u>
Line 50, please change "$(y-\alpha)-$" to -- $(y-\alpha)+$ --

<u>Column 18,</u>
Line 16, please change "$(y-\alpha)-$" to -- $(y-\alpha)+$ --
Line 42, change "a equals" to -- $\alpha$ equals --.

Signed and Sealed this

Seventeenth Day of December, 2002

JAMES E. ROGAN
*Director of the United States Patent and Trademark Office*